US010784274B1

(12) United States Patent
Agarwal et al.

(10) Patent No.: US 10,784,274 B1
(45) Date of Patent: Sep. 22, 2020

(54) 3-DIMENSIONAL FLASH MEMORY WITH INCREASED FLOATING GATE LENGTH

(71) Applicant: Intel Corporation, Santa Clara, CA (US)

(72) Inventors: Rahul Agarwal, Rio Rancho, NM (US); Srivardhan Gowda, Boise, ID (US); Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/441,500

(22) Filed: Jun. 14, 2019

(51) Int. Cl.
| | |
|---|---|
| *H01L 27/1157* | (2017.01) |
| *H01L 27/11556* | (2017.01) |
| *H01L 27/11524* | (2017.01) |
| *H01L 23/532* | (2006.01) |
| *H01L 27/11582* | (2017.01) |

(52) U.S. Cl.
CPC .. *H01L 27/11556* (2013.01); *H01L 23/53295* (2013.01); *H01L 27/11524* (2013.01); *H01L 27/1157* (2013.01); *H01L 27/11582* (2013.01)

(58) Field of Classification Search
CPC .......... H01L 27/11556; H01L 23/53295; H01L 27/11524; H01L 27/11582; H01L 27/1157
See application file for complete search history.

(56) References Cited

U.S. PATENT DOCUMENTS

| | | | | |
|---|---|---|---|---|
| 8,878,279 | B2 * | 11/2014 | Koval | ............... H01L 29/40114 |
| | | | | 257/315 |
| 10,217,755 | B2 | 2/2019 | Kim et al. | |
| 2014/0264542 | A1 | 9/2014 | Simsek-Ege et al. | |

* cited by examiner

Primary Examiner — Kyoung Lee
(74) *Attorney, Agent, or Firm* — Finch & Maloney PLLC

(57) ABSTRACT

An integrated circuit memory cell includes a floating gate, a control gate, and a plurality of inter-poly dielectric (IPD) layers. The IPD layers include an IPD1 layer, an IPD2 layer, and an IPD3 layer, with the IPD2 layer interposed between the IPD1 and IPD3 layers. The IPD2 layer, which may be a nitride, does not flank the floating gate. Thus, no section of the floating gate is laterally between two sections of the IPD2 layer. Also, no section of the IPD2 layer of a first memory cell is between the floating gate of the first memory cell and a floating gate of an immediate adjacent memory cell of the same memory cell string. In some cases, an IPD4 layer is provided between the floating gate and the IPD3 layer. The IPD4 layer is relatively much thinner than layers IPD1-3 and may flank the floating gate, as may the IPD3 layer.

20 Claims, 12 Drawing Sheets

US 10,784,274 B1

3-DIMENSIONAL FLASH MEMORY WITH INCREASED FLOATING GATE LENGTH

BACKGROUND

Flash memory utilizes floating gate transistors, such as metal-oxide-semiconductor field-effect transistors (MOSFETs), as memory cells to store information. Principle among commercialized flash memory are NAND and NOR memory types. In NAND memory, individual memory cells include a control gate and a floating gate. Multiple inter-poly dielectric (IPD) layers are laterally between the control gate and the floating gate. For example, in a memory cell of a NAND flash memory, at least three IPD layers (e.g., IPD1, IPD2, IPD3 layers) are interposed between the control gate and the floating gate. The IPD1 layer is nearest (e.g., among the three IPD layers) to the control gate, and the IPD2 layer is interposed between the IPD1 and IPD3 layers. The IPD2 layer of a standard cell includes a nitride or more generally, nitrogen. As is further typical in a standard memory cell, the IPD2 layer often flanks the floating gate. In particular, at least a section of the floating gate is laterally between two sections of the nitrogen-containing IPD2 layer. As will be appreciated in light of this disclosure and explained in turn, there exists a number of non-trivial issues associated with such flanking of the floating gate by a nitrogen-containing IPD layer.

DETAILED DESCRIPTION

Figure 1:
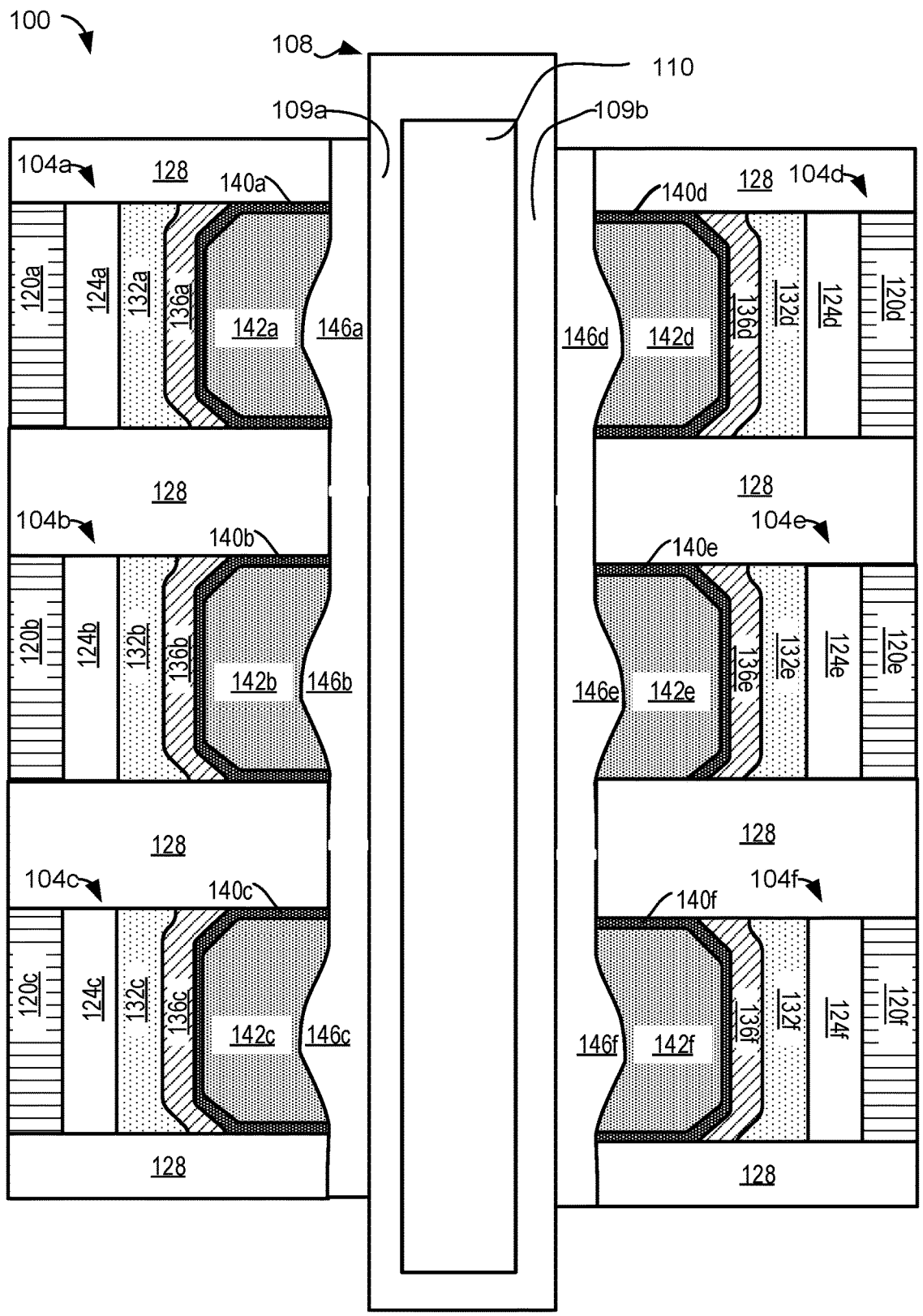
FIG. 1 illustrates a section of a flash memory comprising a plurality of memory cells, wherein in a memory cell, an inter-poly dielectric (IPD) layer comprising nitrogen does not flank a corresponding floating gate of the memory cell, in accordance with some embodiments.

As previously mentioned, in some flash memory devices, at least three IPD layers, such as IPD1, IPD2, IPD3 layers, are interposed between a control gate and a floating gate of a memory cell. In a standard such cell, the IPD2 layer includes a nitride and is interposed between the IPD1 and IPD3 layers, which are oxide layers. In some memory cells, a further IPD layer, such as an IPD4 layer (which contains nitrogen in some examples), is interposed between the IPD3 layer and the floating gate. This IPD4 layer is relatively thin, compared to the IPD1, IPD2, IPD3 layers. The relatively thicker IPD2 layer flanks the floating gate, along with the IPD3 layer and the IPD4 layer (if present) also flanking the floating gate. For example, at least a section of the floating gate is laterally between two sections of the IPD2 layer. Similarly, at least a section of the floating gate is laterally between two sections of each of the IPD3 and IPD4 layers. As will be appreciated in light of this disclosure, presence of the relatively thick flank portions of the IPD layers that flank the floating gate can cause problems. For instance, these flank portions consume space within the cell and therefore limit the length of the floating gate. In addition, in cases where IPD2 contains a nitride, it is further believed that the nitride-containing flank portions of that IPD2 layer around sides of the floating gate (as seen in typical flash memories) can cause capacitive interference and unwanted charge trapping, thereby degrading performance of the memory cell. Furthermore, flank portions of the IPD2 layer around the sides of the floating gate do not serve any structural and/or electrical purposes.

Thus, flash memory cells are herein disclosed in which at least one of the IPD layers (such as IPD2 and/or IDP3) do not flank a corresponding floating gate. In one such embodiment, a flash memory cell is provided in which a nitride-containing IPD2 layer does not flank a corresponding floating gate. For example, no portion of the floating gate of a memory cell is laterally between any two sections of the corresponding nitride-containing IPD2 layer of the memory cell. In a more general sense, no portion of the floating gate of a memory cell is laterally between at least one of the three IPD layers closest to that floating gate of the memory cell. Note that the IPD layers are each a continuous layer.

Eliminating the flank section of the IPD2 layer has several advantages. For example, such elimination of the flank section of the IPD2 layer can reduce or eliminate capacitive interference, as well as unwanted charge trapping, thereby improving performance of the memory cell. This is particularly true when the IPD2 layer comprises nitrogen, although other IPD layer materials may cause similar issues. Furthermore, as no section of the IPD2 layer flanks the floating gate, a length of the floating gate can be increased relative to a length of the control gate. For example, in a memory cell having no flank portion of the IPD2 layer, a difference between a length of the floating gate and a length of the control gate for a memory cell is at most 2 nanometer (nm), 4 nm, 6 nm, or 8 nm. In contrast, in a memory cell in which the IPD2 layer flanks the floating gate, the control gate is at least 10 nm longer than the floating gate length. Thus, eliminating flank portions of the IPD2 layer allows a non-trivial increase in the length of the floating gate relative to the length of the control gate. This results in better channel control of the memory cell. This allowance for increased floating gate length relative to the control gate length also allows for future scaling of the memory cell, in which the of the control gate and the floating gate can be reduced, as will be discussed in further detail in turn.

Also disclosed herein are methodologies of forming a 3D NAND flash memory cell in which IPD layers (such as a nitrogen-containing IPD2 layer) do not flank the floating gate. For example, the floating gate and a nitride-containing IPD2 layer of a memory cell are formed within a recess defined by adjacent insulating layers. The nitride-containing IPD2 layer of the memory cell is initially formed, where the IPD2 layer has flank sections and a non-flank section. The non-flank section is covered by a sacrificial material, and then the flank sections of the IPD2 layer is etched (e.g., using a wet etch process). In one such example, the IPD2 layer and the sacrificial material are selected such that these two layers have etch selectivity with respect to each other. In an example, the selective etch process has to provide relative uniformity across the vertical length of the memory pillar (or stack) in which the memory cell is included. That is, the level of etching of the IPD2 layer of the various exposed memory cells have to be relatively uniform, so as to maintain a cross-memory pillar etch uniformity, according to an embodiment. Furthermore, the selective etch processes can also provide uniformity across the wafer on which the memory pillar is formed.

Thus, the etch chemistry used to etch the nitride-containing IPD2 layer is to have good selectivity to the sacrificial material as compared to the nitride-containing IPD2 layer, according to an embodiment. Furthermore, the etch chemistry to etch the nitride-containing IPD2 layer is to also have good selectivity to the insulating layers adjacent to the memory cell. As discussed in turn, in an example embodiment, phosphoric acid (e.g., at a relatively high temperature) is used as an etchant to remove flank portions of the nitride-containing IPD2 layer. Hot phosphoric acid has excellent etch selectivity to the sacrificial material and/or the insulating layers, as compared to the nitride-containing IPD2 layer. However, hot phosphoric acid as an etchant may not provide sufficient cross-memory pillar etch uniformity and/or cross-wafer etch uniformity, and therefore may not be appropriate for some applications.

So, in another example embodiment, hydrofluoric acid (HF) can be used as an etchant to remove flank portions of the nitride-containing IPD2 layer. For example, ultra-diluted HF may be used. The HF may be diluted, for instance, in the ratio of 2000:1 (e.g., 1 part HF in 2000 parts water, such as de-ionized water). Diluted HF has excellent etch selectivity to the sacrificial material, as compared to the nitride-containing IPD2 layer. Diluted HF has also reasonably good etch selectivity to the insulating layers, as compared to the nitride-containing IPD2 layer. Furthermore, ultra-diluted HF as an etchant also provides relatively high cross-memory pillar etch uniformity and/or cross-wafer etch uniformity.

Thus, in a more general sense, any appropriate etchant that is sufficiently selective to the sacrificial material (e.g., polysilicon) and material of the insulating layers (e.g., silicon oxide or other oxide), as compared to material of the IPD2 layer (e.g., silicon nitride or other nitride), and that provides acceptable cross-memory pillar etch uniformity and/or cross-wafer etch uniformity, may be used.

In an example, during the etching of the nitride-containing IPD2 layer, sections of the insulating layer may also be at least in part etched, albeit at a relatively much slower rate than the nitride-containing IPD2 layer. To at least in part compensate for such etching of the insulating layer, it may be useful to form the IPD3 layer at least in part over the insulating layer, according to an embodiment. In a memory cell in which the nitride-containing IPD2 is not etched and in which the IPD2 layer flanks the floating gate, the IPD3 layer is thermally grown via oxidation over the IPD2 layer. However, if the IPD3 layer is to be thermally grown via oxidation, the IPD3 layer would not grow over the insulating layer, and hence, cannot compensate for the etching of the insulating layer.

So, in an embodiment, to allow the IPD3 layer to be formed over the insulating layer (e.g., to at least in part compensate for the etching of the insulating layer), the IPD3 layer is deposited over the IPD2 layer and the insulating layer (instead of growing via thermal oxidation). This allows the IPD3 layer to at least in part compensate for the etching of the insulating layer.

As discussed herein, terms referencing direction or orientation, such as upward, downward, vertical, horizontal, left, right, front, back, top, bottom, and side are used for convenience to describe embodiments of integrated circuits having a base or substrate extending in a horizontal plane. Embodiments of the present disclosure are not intended to be limited by these; rather, integrated circuits and device structures in accordance with the present disclosure can be used in any orientation, and such terms can simply be adjusted to accommodate the given orientation.

It two materials are herein said to be "compositionally different" or "compositionally distinct" then those two materials have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Elements referred to herein with a common reference label followed by a particular number or alphabet may be collectively referred to by the reference label alone. For example, memory cells 104a, 104b, 104c, 104d, 104e, 104f may be collectively and generally referred to as memory cells 104 (a-f) or simply memory cells 104 in plural, and memory cell 104 in singular.

Architectures

FIG. 1 illustrates a cross-section of a section of flash memory 100 (also referred to as a memory 100) comprising a plurality of memory cells 104, wherein in a given memory cell 104 (a-f), an inter-poly dielectric (IPD) layer 132 (a-f) comprising nitrogen (or other issue-causing material) does not flank a corresponding floating gate 142 (a-f) of the memory cell 104 (a-f), in accordance with some embodiments. As can be further seen in FIG. 1, the cross-section of the memory 100 is taken with a vertically oriented cut plane to show various features and geometries of the memory 100. The memory 100 includes a memory pillar 108, and memory cells 104a, 104b, 104c, 104d, 104e, 104f are located on the memory pillar 108. In an embodiment, the memory 100 is a 3D NAND flash memory. Various examples and embodiments of this disclosure specifically discuss an example memory cell 104, such as the memory cell 104a. Various other memory cells 104b, . . . , 104f may have a structure that is similar to the structure of the memory cell 104a.

As will be discussed in further detail herein, an individual memory cell 104, such as the memory cell 104a, comprises a floating gate 142a and a control gate 120a. A plurality of IPD layers, such as IPD layers 124a, 132a, 136a, and 140a are laterally between the floating gate 142a and the control gate 120a. Some other example embodiments don't include 140. In any such example cases, the IPD layer 124a is laterally between the IPD layer 132a and the control gate 120a; the IPD layer 132a is laterally between the IPD layer 124a and the IPD layer 136a; the IPD layer 136a is laterally between the IPD layer 132a and IPD layer 140a; and the IPD layer 140a is laterally between the IPD layer 136a and the floating gate 142a. For ease of identification, the IPD layer 124a (i.e., a first one of the plurality of IPD layers closest to the control gate) is also referred to as a first IPD layer, or IPD1 layer; the IPD layer 132a is also referred to as a second IPD layer, or IPD2 layer; the IPD layer 136a is also referred to as a third IPD layer, or IPD3 layer; and the IPD layer 140a closest to the floating gate 142a is also referred to as a fourth IPD layer, or IPD4 layer.

As illustrated, the IPD layer 132a is laterally between the floating gate 142a and the control gate 120a. As discussed in further detail herein, in an example embodiment, the IPD layer 132a (i.e., the IPD2 layer) does not flank the floating gate 142a. Put differently, no portion of the IPD layer 132a is laterally between the floating gate 142a and a layer 128 comprising insulating material. Thus, no portion of the IPD layer 132a is laterally between the floating gate 142a of the memory cell 104a and a floating gate 142b of an adjacent memory cell 104b.

There are several advantages of the IPD layer 132a not flanking the floating gate 142a, as will be discussed herein in detail. For example, presence of flank portions of the IPD layer 132a around the sides of the floating gate 142a (e.g., as seen in typical flash memories) can impact capacitive interference and unwanted charge trapping, thereby degrading performance of the memory cell. Furthermore, flank portions of the IPD layer 132a around the sides of the floating gate 142a do not serve any structural and/or electrical purposes. Eliminating any flank section of the IPD layer 132a eliminates the above discussed issues and improves performance of the memory cell 104a.

Figure 2:
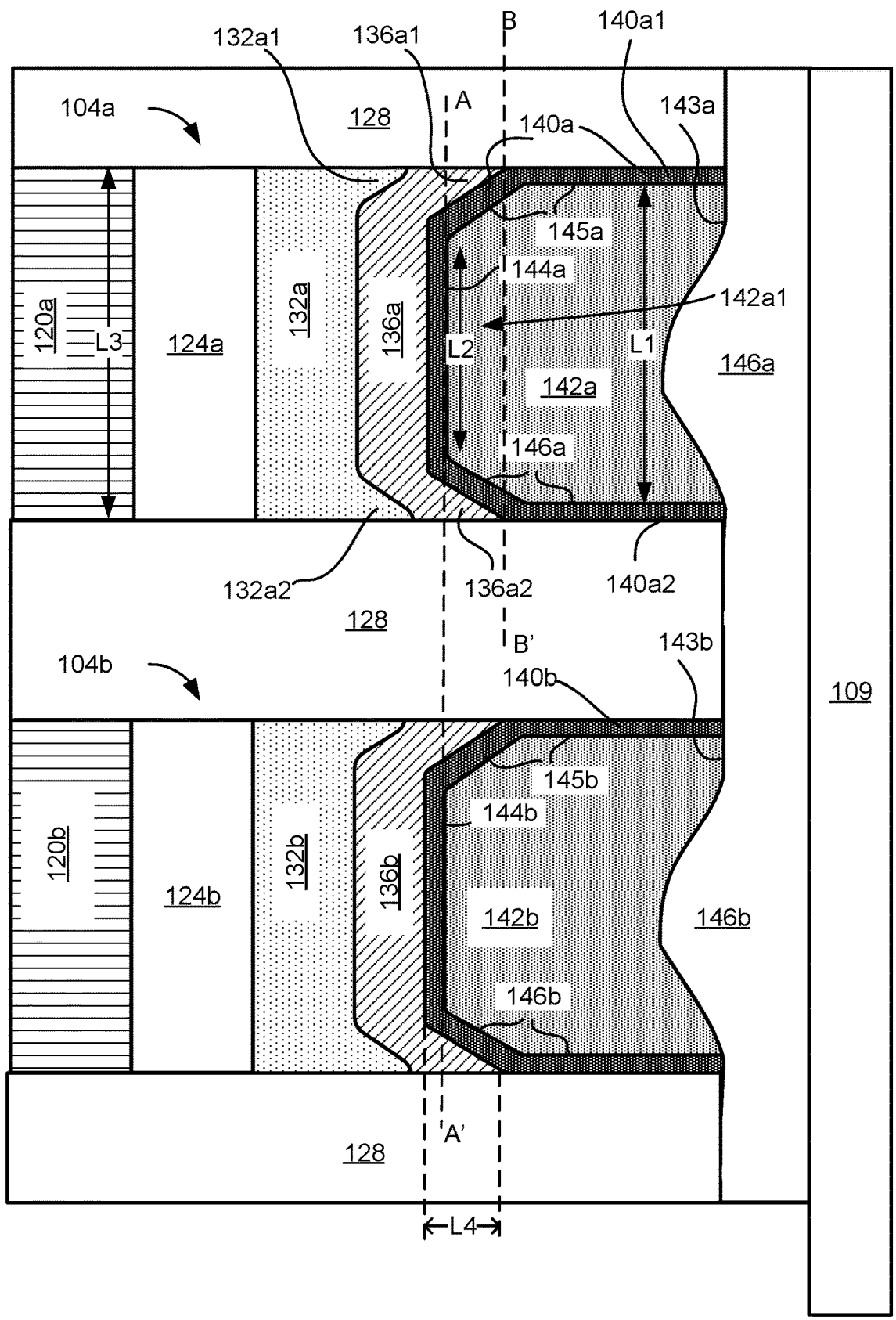
FIG. 2 illustrates two adjacent memory cells of the memory of FIG. 1 in further detail, in accordance with some embodiments.

Furthermore, eliminating any flank section of the IPD layer 132a, as further discussed with respect to FIG. 2, allows an increase in a length of the floating gate 142a (e.g., without a corresponding increase in the control gate 120a). This results in better channel control of the memory cell 104a. This also allows for future scaling of the memory cell 104a, as will be discussed in further detail.

In the memory 100, the memory cells 104 are arranged in a string. For example, memory cells 104a, 104b, 104c on a first side of the memory pillar 108 form a first string of memory cells (also referred to as memory cell string), and memory cells 104a, 104b, 104c on a second side of the memory pillar 108 form a second string of memory cells.

FIG. 1 illustrates only a portion of the memory pillar 108. For example, although three memory cells are illustrated within each memory cell string of the memory pillar 108, the entire length of the memory pillar 108 can include a much higher number of memory cells per memory cell string, e.g., tens, or even hundreds of memory cells. Although FIG. 1 illustrates only one memory pillar 108, the memory 100 can include multiple such memory pillars.

In the memory 100, the memory cells of a given memory cell string share a common channel region. For example, the memory cell string comprising the memory cells 104a, 104b, 104c share a common channel region 109a, and the memory cell string comprising the memory cells 104d, 104e, 104f share a common channel region 109b. A channel region 109 comprises a conductive channel, which includes, for example, silicon, polysilicon, germanium, silicon germanium, or some other suitable channel material.

In some embodiments, the channel region 109 can have a hollow interior that is filled with an insulating material 110, such as an oxide material. The channel regions 109 and the string of memory cells 104 can be oriented vertically, such as in a three-dimensional memory array. For example, memory cell 104a is located at a vertical level (e.g., nearer to a top of the memory pillar 108) that is above a vertical level (e.g., nearer to a bottom of the memory array) at which memory cell 104c is located. In an example embodiment, the channel region 109 can have a generally cylindrical configuration and the memory cells 104 can be disposed in concentric ring-like structures radially outward from the conductive channel.

Individual memory cells 104, such as memory cell 104a, can be non-volatile memory cells. In more detail, the memory cell 104a has a charge-storage structure, such as the floating gate 142. As the floating gate 142 is used to store charge, the floating gate 142 is also referred to as a charge-storage structure. The floating gate 142 comprises conductive or semi-conductive material, such as polysilicon, silicon nitride (SiN), silicated or non-silicated metal such as ruthenium (Ru), platinum (Pt), germanium (Ge), or other suitable material, with metals being either continuous or discontinuous.

The memory cell 104a comprises a tunnel dielectric layer 146a interposed between the floating gate 142a and the channel region 142a. In an example embodiment, the tunnel dielectric layer 146a is a continuous layer shared by memory cells 104a, 104b, 104c, as illustrated in FIG. 1 (e.g., the tunnel dielectric layers 146a, 146b and 146c are part of a same continuous layer). In another example embodiment, the tunnel dielectric layer 146a is a discontinuous layer and not shared among memory cells 104a, 104b, 104c (e.g., the layer 146a is separate and discontinuous from the layer 146b).

The tunnel dielectric layer 146 between the charge-storage structures (the floating gates 142) and the channel region 109 comprises any suitable dielectric material. For example, the tunnel dielectric layer 146 comprises an oxide material (e.g., silicon oxide). In an example, the tunnel dielectric layer 146 comprises multiple layers (e.g., oxide/nitride/oxide (O/N/O)).

The memory cell 104a comprises a control gate 120a. The control gate 120a, is a portion of, or coupled to, an access line, such as a word line, in some embodiments. The control gate 120a comprises any suitable conductive or semi-conductive material. For example, the control gate 120a can comprise polysilicon (e.g., doped, or undoped), tungsten or other metals, or the like.

As discussed herein above, a plurality of IPD layers, such as IPD layers 124a, 132a, 136a, and 140a, are laterally interposed between the floating gate 142a and the control gate 120a. For example, the IPD layer 124a is laterally between the IPD layer 132a and the control gate 120a; the IPD layer 132a is an intermediate layer in that it is laterally between the IPD layer 124a and the IPD layer 136a; the IPD layer 136a is also an intermediate layer in that it is laterally between the IPD layer 132a and IPD layer 140a; and the IPD layer 140a is laterally between the IPD layer 136a and the floating gate 142a. The IPD layers 124a, 132a, 136a, and 140a serve as blocking dielectrics between the floating gate 142a and the control gate 120a.

In an embodiment, the IPD layers 124a, 132a, 136a, and 140a comprise appropriate dielectric material. In an example embodiment, the IPD layer 124a (i.e., the IPD1 layer) comprises material including oxygen. For example, the IPD layer 124a comprises oxide material (e.g., silicon oxide), an oxynitride material (e.g., silicon oxynitride), and/or a high dielectric constant material (e.g., hafnium oxide, hafnium silicon oxide, aluminum oxide, zirconium oxide, to name a few examples). Other example high-k dielectric materials include, for instance, zirconium silicon oxide, tantalum oxide, titanium oxide, barium strontium titanium oxide, barium titanium oxide, strontium titanium oxide, yttrium oxide, and lead scandium tantalum oxide.

In an embodiment, the IPD layer 132a (i.e., the IPD2 layer) comprises material including nitrogen. For example, the IPD layer 132a comprises a nitride material (e.g., silicon nitride).

In an embodiment, the IPD layer 136a (i.e., the IPD3 layer) comprises a material including oxygen. For example, the IPD layer 136a comprises an oxide material (e.g., silicon oxide), an oxynitride material (e.g., silicon oxynitride), and/or a high dielectric constant material such as those noted above.

In an example embodiment, the IPD layer 140a (i.e., the IPD4 layer) comprises a nitride material (e.g., silicon nitride), an oxide material (e.g., aluminum oxide), and/or a high dielectric constant material such as those noted above.

In an embodiment, the IPD4 layer, i.e., IPD layer 140a, may be absent from the memory cell 104a. In an example, the IPD layers 124a, 132a, 136a include alternating layers of oxide material (e.g., silicon oxide) and nitride material (e.g., silicon nitride), thus being configured as ONO (oxide/nitride/oxide) in successive layers 124a, 132a, 136a. In an embodiment, the IPD layers 140a, 136a, 132a, 124a can be configured as NONO (nitride/oxide/nitride/oxide) or as AONO (AlO$_x$/oxide/nitride/oxide) in successive layers 140a, 136a, 132a, 124a.

In an embodiment, the memory cells 104 are separated by a layer 128. The layer 128 acts as a spacer between adjacent memory cells of a memory cell string. The layer 128 is an insulating layer comprising appropriate insulating material, such as an oxide material (e.g., silicon oxide), an oxynitride material (e.g., silicon oxynitride), a nitride material (e.g., silicon nitride), or some other suitable insulator material. In an example, the layer 128 is also referred to as a tier oxide layer. The memory pillar 108, including the channel region 109 and the memory cells 104, may extend vertically along (e.g., through) the layer 128. The layer 128 separates two adjacent memory cells.

In the memory 100, an end of the channel region 109 can be coupled to a data line (e.g., a bit line). For example, a switching arrangement (e.g., comprising a select gate) can selectively couple a memory cell string to the data line. In addition, another end of the channel region 109 can be electrically coupled to a source line. For example, another switching arrangement (e.g., comprising another a select gate) can selectively couple the memory cell string to the source line. The structure and configuration of the bit line, source line, and the switching arrangements will be apparent.

FIG. 2 illustrates two adjacent memory cells 104a, 104b of the memory 100 of FIG. 1 in further detail, in accordance with some embodiments. The size, geometry, and relationships of various memory cell components are described with reference to FIG. 2. As a schematic representation, FIG. 2 does not necessarily depict certain features as they would be found in an actual memory cell. For example, straight lines shown in the figure may not be exactly straight, and sharp corners may be rounded.

Referring to the memory cell 104a in FIGS. 1 and 2, the floating gate 142a has a first side surface 143a facing the channel region 109, and an opposite side surface 144a facing the control gate 120a. In an example, the vertical cross-section of the floating gate 142a has a non-rectangular shape. In the example of FIG. 2, the floating gate 142a has a somewhat rectangular or trapezoidal shape. Other shapes of the floating gate 142a may also be possible. For example, the floating gate 142a may have a circular or ovoid shaped vertical cross-section. In another example, the floating gate 142a can have a generally triangular shaped vertical cross-section with a very rounded tip oriented toward the control gate 120a, which can resemble a generally trapezoidal shape.

The side surface 143a of the floating gate 142a oriented towards the channel region 109a has a length L1, and the opposite side surface 144a oriented towards the control gate 120a has a length L2. In the example of FIG. 2, length L1 is greater than length L2. The length L1 may be considered as a length (e.g., vertical length) of the floating gate 142a. In an example, the lengths L1 and L2 are along a vertical direction, i.e., are along directions parallel to a direction of the channel region 109a. The floating gate 142 also has one or more side surfaces 145a between side surfaces 143a and 144a, and opposing one or more side surfaces 146a between side surfaces 143a and 144a. The side surfaces 146a of the memory cell 104a face the adjacent memory cell 104b, and the opposing side surfaces 145b of the memory cell 104a face another adjacent memory cell.

The control gate 120a has a length L3 along the vertical direction. In an example, L1 is less than L3. For example, as the IPD layer 140a (and to an extent the IPD layer 136a) flanks the floating gate 142a along the side surfaces of the floating gate 142, the length L1 is less than L3.

In FIG. 2, an imaginary straight line AA' joins and extends through the side surface 144a of the memory cell 104a and the side surface 144b of the memory cell 104b. That is, the side surface 144a (or at least a section of the side surface 144a) and the side surface 144b (or at least a section of the side surface 144b) are on the line AA'. The line AA' is along the vertical direction, i.e., is along a direction parallel to a direction of the channel region 109.

The IPD layer 136a has flank sections 136a1 and 136a2. For example, the flank sections 136a1 and 136a2 are on a side of the line AA' that faces the channel 109. Thus, the flank sections 136a1 and 136a2 flank the floating gate 142 on opposing sides. Put differently, the IPD layer 136a has sections that are interposed laterally between the floating gate 142a and the control gate, and has flank sections 136a1 and 136a2 that extend towards the floating gate 142a.

Assume an imaginary straight line BB' joining the tip of the sections 136a1, 136a2, and assume that section 142a1 of the floating gate 142a is between the line BB' and the side surface 144a, as illustrated in FIG. 2. Thus, the section 142a1 of the floating gate 142 is laterally between section 136a1 and section 136a2 of the IPD layer 136a. That is, the IPD layer 136a wraps around at least sections of the side surfaces 145a, 146a of the floating gate 142a.

Illustrated in FIG. 2 is a length L4 of the flank sections 136a1 and 136a2 of the section 136a (for purposes of clarity, the length L4 is marked in the memory cell 104b, and not in the memory cell 104a). The length L4 may be based on a manner in which the IPD layer 136a is formed, as will be discussed in further detail in turn. For example, in the example of FIG. 2, the IPD layer 136a is thermally oxidized from the IPD layer 132, and hence, the length L4 of the section 136a1 may be somewhat similar to the length of the section 132a1 of the IPD layer 132a.

However, in another example and as discussed herein elsewhere (e.g., FIG. 3) in further detail, the IPD layer 136a may be formed by depositing a film, in which case the length L4 can be controlled. In such an example, when the IPD layer 136a is formed by depositing a film, the IPD layer 136a may be over an entirety (or almost the entirety) of the side surfaces 145a, 146a, as discussed herein elsewhere in further detail.

In an example, the ILD layer 140a are on the sides 144a, 145a, and 146a of the floating gate 142. Thus, the ILD layer 140a has sections 140a1 and 140a2 that flank the floating gate 142a. That is, sections of the floating gate 142a (e.g., the entire the floating gate 142a in the example of FIG. 2) is laterally between two sections 140a1, 140a2 of the IPD layer 140a.

In an example, the IPD layer 132a is interposed laterally between the floating gate 142a and the control gate 120a. Sections 132a1 and 132a1 of the IPD layer 132a extend towards the floating gate 142a. However, the sections 132a1 and 132a1 of the IPD layer 132a do not flank the floating gate 142a. For example, the entirety of the IPD layer 132a is on a side of the line AA' that faces the control gate 120a (e.g., no section of the IPD layer 132a is on a side of the line AA' that faces the channel 109). Thus, no section of the floating gate 142a is laterally between the sections 132a1 and 132a2 of the IPD layer 132a. Put differently, no section of the floating gate 142a is laterally between any two sections of the IPD layer 132a, as illustrated in FIG. 2. No section of the IPD layer 132a is laterally between the floating gate 142a of the memory cell 104a and the floating gate 142b of the immediate adjacent memory cell 104b of the same memory cell string, as illustrated in FIG. 2.

Also, as illustrated, no section of the IPD layer 124a flank the floating gate 142a. Put differently, no section of the floating gate 142a is laterally between any two sections of the IPD layer 124.

The size and/or geometry of the floating gate 142a and the various IPD layers are interrelated. For example, because the IPD layer 132a does not flank the floating gate 142, the floating gate lengths L1 and L2 can be relatively higher. If the IPD layer 132a was to flank the floating gate 142 (e.g., if the sections 132a1, 132a2 of the IPD layer 132 were to cross the line AA', and be on the side of the line AA' facing the channel region 109), the lengths L1 and L2 would decrease correspondingly. However, because no section of the floating gate 142a is laterally between the sections 132a1 and 132a2 of the IPD layer 132a, the lengths L1 and L2 are relatively higher. As a result, material of the floating gate 142a can effectively replace material of the IPD layers. Put differently, as the IPD layer 132a does not flank the floating gate 142a, there is relatively less IPD dielectric material laterally between the floating gate 142a and the layer 128. Further note that IPD layer 140a in this example embodiment is relatively thinner than the other IPD layers 136a, 132a and 124a. In an embodiment, IPD layers 136a, 132a and 124a are at least 2× or more thicker than IPD layer 140a. For instance, in some such embodiments, IPD layers 136a, 132a and 124a can be two to five time thicker than IPD layer 140a, according to some embodiments. Note that, because IPD layer 140a is relatively thin, the fact that it flanks the floating gate 142a is less problematic than if IPD layer 132a flanks the floating gate, as will be appreciated in light of this disclosure.

Such a decrease in the size of the flank portions of the various IPD layers and a corresponding increase in the size of the floating gate 142a can provide performance benefits. For example, presence of flank portions of the IPD layer 132a around the sides of a floating gate (e.g., as seen in typical flash memories) can impact capacitive interference and unwanted charge trapping, thereby degrading performance of the memory cell. Furthermore, flank portions of the IPD layer 132a around the sides of a floating gate (e.g., as seen in typical flash memories) does not serve any structural and/or electrical purposes. Eliminating any flank section of the IPD layer 132a, as discussed with respect to FIGS. 1 and 2, eliminates the above discussed issues and improves performance.

Furthermore, eliminating any flank section of the IPD layer 132a, as discussed with respect to FIGS. 1 and 2, allows for an increase in lengths L1 and L2 of the floating gate 142a. This results in better channel control of the memory cell 104a.

Furthermore, due to the increase of the lengths L1 and L2 of the floating gate 142a, the ratio between the length L3 and L1, and also the ratio between the length L3 and L2, are decreased. In an example embodiment, the length L3 is about 35 nanometers (nm), the length L1 is about 33 nm, and the length L2 is 30 nm. Thus, the length L1 is about 2 nm less than the length L1. If the IPD layer 132a were to flank the floating gate 142a, such as in a conventional flash memory cell, the lengths L1 and L2 could have been as low as 23 nm and 15-16 nm, respectively, for a length L3 of 35 nm. Thus, eliminating any flank section of the IPD layer 132a significantly increases the lengths L1 and L2 (e.g., the length L1 can increase by about 10 nm). Increasing the lengths L1 and/or L2 results in better Gate Coupling Ratio (GCR) of the memory cell 104a, and/or results in better control of the channel 109.

In an example, a difference between lengths L3 and L1, in the above discussed example scenario, is about 2-3 nm. In other examples, this difference can be less than 4 nm, 6 nm, 8 nm, 10 nm, or the like, e.g., based on a thickness of the IPD layer 140a, and a thickness and size of the flank sections 136a1 and 136a2 of the IPD layer 136a. In contrast, in a memory cell in which the IPD layer 132a flanks the floating gate 142a, this difference can be in the range of 10-14 nm.

In an example, as the difference between lengths L3 and L1 (and also the difference between lengths L3 and L2) is decreased in the memory cell 104a, the control gate 120a and the floating gate 142a can be scaled, e.g., to decrease the lengths L1, L2, L3, without significantly impacting a performance of the memory cell 104a. However, such scaling cannot be easily achieved in a memory cell in which the IPD layer 132a flanks the floating gate 142a, as such scaling would further decrease the already reduced lengths L1 and L2 in such a memory cell, thereby severely impacting the performance of the memory cell. Thus, in memory cells in which the IPD2 layer (i.e., IPD layer 132a) does not flank the floating gate, the length of the control gate and the floating gate can be decreased, without an adverse effect on the performance of the memory cells.

Figure 3:
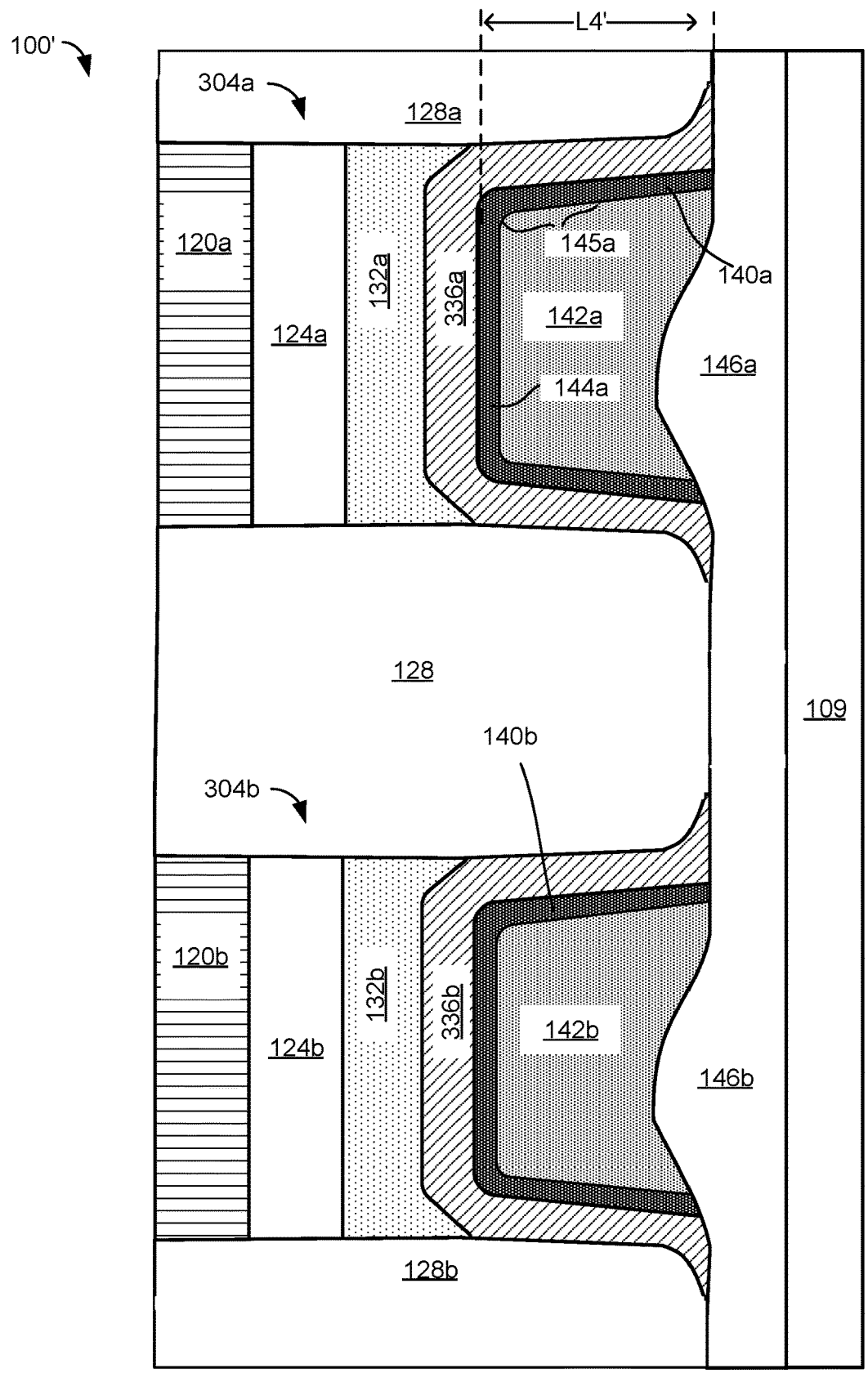
FIG. 3 illustrates memory cells of a flash memory that is similar to the memory cells of FIGS. 1 and 2, except that an IPD3 layer of a memory cell of FIG. 3 flanks a greater section of the corresponding floating gate of the memory cell, in accordance with some embodiments.

FIG. 3 illustrates memory cells 304a, 304b of a flash memory 100' that is similar to the memory cells 104a, 104b of FIGS. 1 and 2, except that the IPD3 layer (e.g., IPD layers 336a, 336b) of a memory cell 304a of FIG. 3 flanks a greater section of a floating gate 142a of the memory cell 304a (e.g., as compared to that in the memory cells of FIGS. 1 and 2), in accordance with some embodiments. The memory cell 304a of FIG. 3 is discussed in detail, and the memory cell 304b (and also various other memory cells of the memory pillar) has a structure similar to the memory cell 304a. Various components of the memory cell 304a are at least in part similar to those of the memory cell 104a, and similar components in these two memory cells are labelled using similar label. For example, similar to the memory cell 104a, the memory cell 304a comprises the channel region 109, the floating gate 142a, the control gate 120a, tunnel dielectric layer 146a, insulating layer 128, IPD layers 124a, 132a, 140a. However, the IDP3 layer of the memory cell 304a (e.g., which is interposed between the IPD layers 132a and 140a), labelled as IPD layer 336a, is different from the IPD3 layer (i.e., IPD layer 136a) of the memory cell 104a.

For example, the IPD layer 336a of the memory cell 304a flanks a greater portion of the side surfaces 145a of the floating gate 142a (e.g., compared to that in the memory cell 104a). In the example embodiment of FIG. 3, the IPD layer 336a of the memory cell 304a flanks substantially an entirety of the side surfaces 145a of the floating gate 142a. A flank portion of the IPD layer 336a has a length L4', as illustrated.

For example, as discussed with respect to FIG. 2 and as will also be discussed in further detail in turn, in the memory cell 104a, the IPD layer 136a is thermally oxidized from the IPD layer 132, and hence, the length L4 of the section 136a1 may be somewhat similar to a length of the section 132a1 of the IPD layer 132a. In contrast, in the memory cell 304a of FIG. 3, the IPD layer 136a is formed by depositing a film, in which case the length L4' can be controlled.

FIGS. 4A, 4B, 4C, 4D, 4E, 4E', 4F, 4G, 4H, and 4I collectively illustrate example methods for forming a memory cell of a flash memory, such as the memory cell 104a of FIGS. 1 and 2, where a IPD2 layer (such as the layer 132a) of the memory cell does not flank a floating gate 142a of the memory cell, in accordance with some embodiments of the present disclosure. Cross sectional views of the memory cell 104a, while the memory cell 104a is being formed, are illustrated in FIGS. 4A-4I.

Figure 4A:
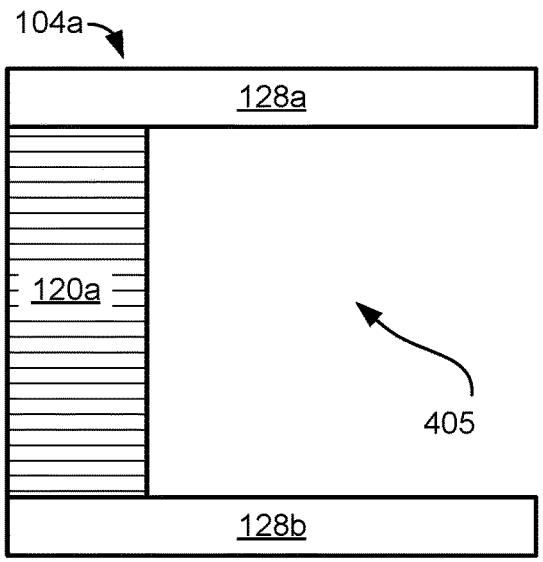
FIGS. 4A, 4B, 4C, 4D, 4E, 4E', 4F, 4G, 4H, and 4I collectively illustrate an example method for forming a memory cell of a flash memory, such as a memory cell of FIGS. 1 and 2, where a nitrogen containing IPD2 layer of the memory cell does not flank a floating gate of the memory cell, in accordance with some embodiments of the present disclosure.

Referring to FIG. 4A, illustrated are the layers 128a and 128b comprising insulating material vertically spaced apart (in FIGS. 1 and 2, the layers 128a, 128b are generally labelled as layer 128). The control gate 120a is between the layers 128a, 128b. The layers 128a, 128b, and the control gate 120a define a recess or opening 405, where the IPD layers and the floating gate are to be formed later.

Figure 4B:
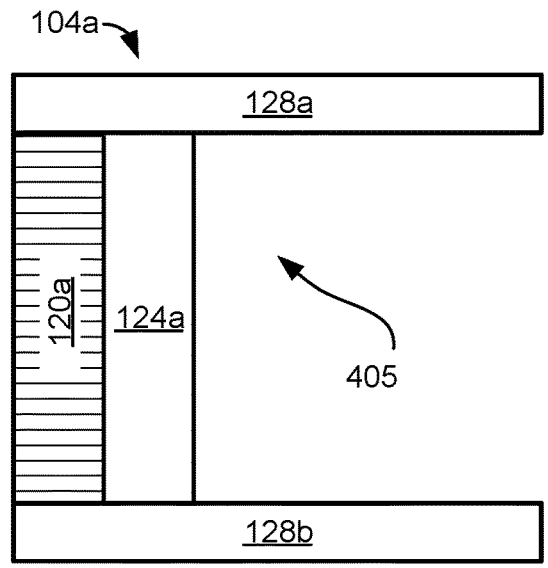

Referring to FIG. 4B, the IPD layer 124a is formed on the control gate 120 within the recess 405. In an example embodiment, the IPD layer 124a is formed by thermal oxidation process on the control gate 120. For example, a portion of the control gate 120, which is exposed through the recess 405, may be oxidized, resulting in the IPD layer 124a. Any suitable oxidation process can be utilized. In another example embodiment, the IPD layer 124a may be formed through any appropriate type of deposition process.

Figure 4C:
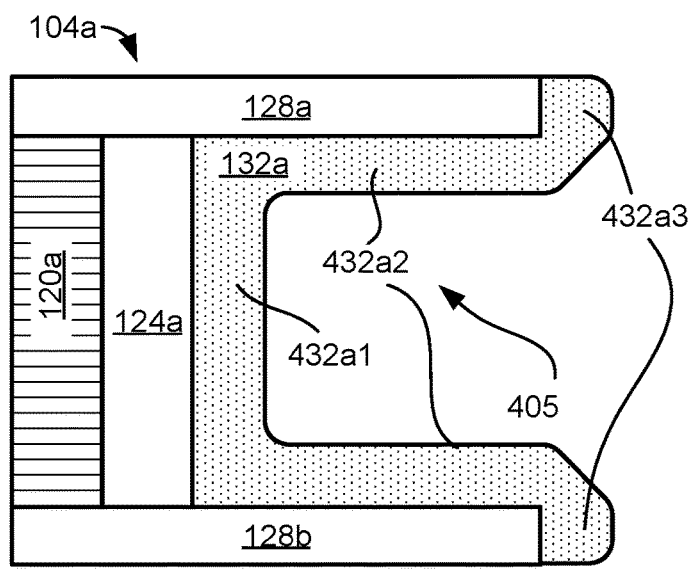

Referring to FIG. 4C, the IPD layer 132a is deposited within the recess 405, e.g., to cover the exposed surfaces of the IPD layer 124a, and the layers 128a, 128b within the recess 405. In an example, the IPD layer 132a also covers vertical exposed portions of the layers 128a, 128b, as illustrated. In an example, the IPD layer 132a is conformally deposited. The deposition of the IPD layer 132a is performed using chemical vapor deposition (CVD), atomic layer deposition (ALD), physical vapor deposition (PVD), diffusion, and/or any appropriate deposition technique. As illustrated, the IPD layer 132a can be broadly categorized to have a section 432a1 that is on the IPD layer 124a, two sections 432a2 that are on the horizontal sections of the layers 128a, 128b within the recess 405, and two sections 432a3 that are on the vertical sections of the layers 128a, 128b outside the recess 405.

The sections 432a2 and 432a3 form sidewalls and flank sections of the IPD layer 132a, and do not contribute to electrical or structural properties of the final memory cell. Accordingly, an entirety or at least most of the sections 432a2 and 432a3 of the IPD layer 132a are removed subsequently, as discussed in turn herein.

Figure 4D:
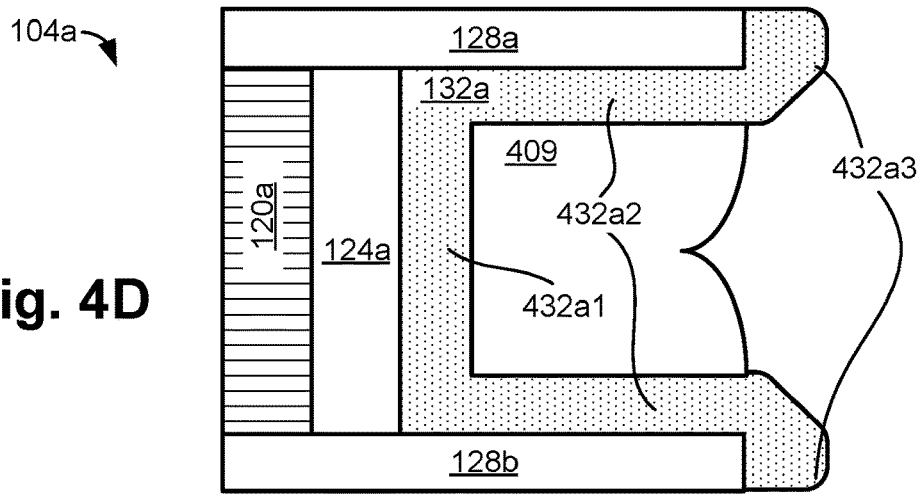

Referring now to FIG. 4D, sacrificial material 409 is deposited within the recess 405, to cover at least sections of the IPD layer 132a. In an example embodiment, the sacrificial material 409 comprises polycrystalline silicon (poly-Si). The deposition of the sacrificial material 409 is performed using CVD, ALD, PVD, diffusion, and/or any appropriate deposition technique. As illustrated, the sacrificial material 409 covers almost the entirety of the recess 405. For example, the sacrificial material 409 covers the section 432a1 of the IPD layer 132a, and covers fully or almost fully the sections 432a2 of the IPD layer 132a. In the example embodiment illustrated in FIG. 4D, the sacrificial material 409 does not cover any portion of the sections 432a3 of the IPD layer 132a—however, in another example embodiment, the sacrificial material 409 may cover at least portions of the sections 432a3 of the IPD layer 132a.

Figure 4E:
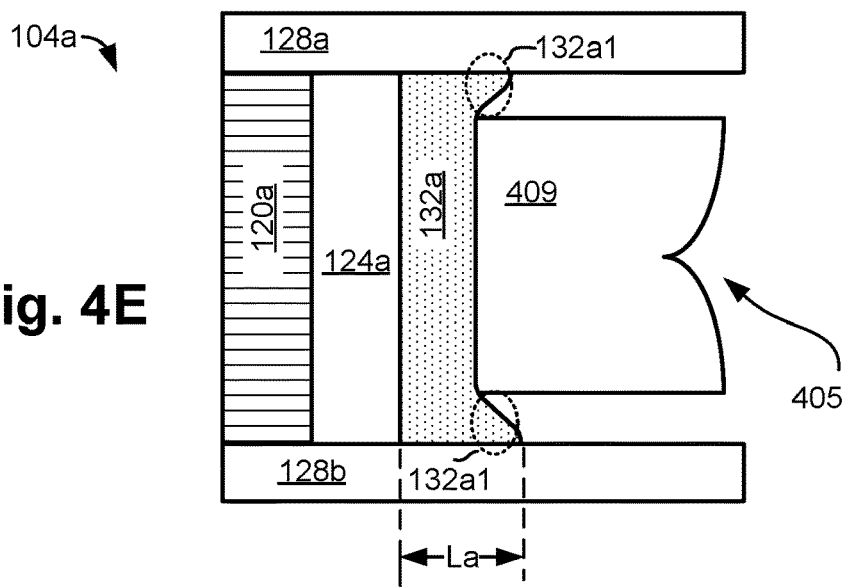
Figure 4E:
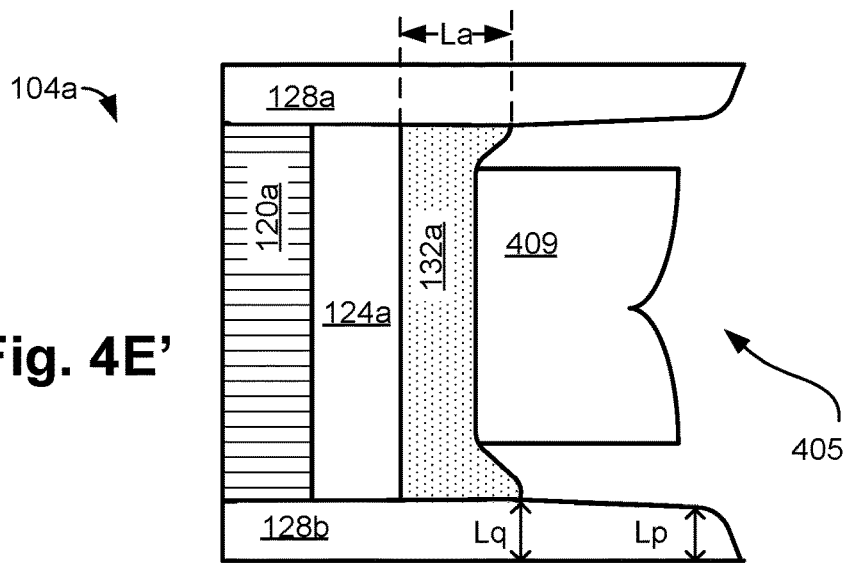

Referring now to FIG. 4E, sections of the IPD layer 132a may be etched, e.g., using a wet etch process. In an example, the IPD layer 132a and the sacrificial material 409 may be selected such that these two layers have etch selectivity with respect to each other. Also note that being able to selectively etch a first material relative to a second material includes being able to use a process that removes the first material at least 1.5, 2, 3, 5, 10, 20, 50, or 100 times faster than that same process removes the second material, or at least some other relative amount. Accordingly, the selective etch processes may include various etchants, temperatures, pressures, etc. as desired to enable the desired selectivity of the process.

In an example, the selective etch process has to provide relative uniformity across the vertical length of the memory pillar 100. For example, the memory cells 104a and 104c (e.g., see FIG. 1) are on different vertical levels of the memory pillar 100. The selective etch processes has to provide uniform etching of individual cells along the vertical dimension of the memory pillar 100. That is, the level of etching of the IPD layer 132a of the memory cell 104a has to be substantially similar to the level of etching of the IPD layer 132c of the memory cell 104c, e.g., to maintain a cross-memory pillar etch uniformity.

Furthermore, the selective etch processes has to provide uniformity across the wafer on which the NAND memory pillar is being formed. For example, the level of etching of the IPD layer 132a of the memory cell 104a of the memory pillar 100 on a wafer has to be substantially similar to an etching of another IPD layer 132 on another memory cell of another memory pillar located elsewhere on the wafer, e.g., to maintain a uniform cross-wafer etch uniformity.

The wet etch chemistry to etch the IPD layer 132a is to have good selectivity to the sacrificial material 409 as compared to the IPD layer 132a (i.e., the material of the IPD layer 132a etches much faster than the sacrificial material 409). Furthermore, the wet etch chemistry to etch the IPD layer 132a is to also have good selectivity to the layers 128 as compared to the IPD layer 132a (i.e., the material of the IPD layer 132a etches much faster than the layers 128), e.g., such that the layers 128 are not significantly removed. Thus, the wet etch chemistry to etch the IPD layer 132a is to have good selectivity to the sacrificial material 409 and the layers 128 as compared to the IPD layer 132a.

For example, as discussed, in an embodiment, the sacrificial material 409 comprises polycrystalline silicon (poly-Si), and the IPD layer 132a comprises a nitride material (e.g., silicon nitride). The layer 128 is an insulating layer comprising, for example, an oxide material (e.g., silicon oxide).

In an example embodiment, phosphoric acid (e.g., at a relatively high temperature) may be selected as an etchant. Hot phosphoric acid has excellent etch selectivity to the sacrificial material 409 and/or the layers 128, as compared to the IPD layer 132a. However, in an example, hot phosphoric acid as an etchant may not provide relatively high cross-memory pillar etch uniformity and/or cross-wafer etch uniformity.

In another example embodiment, hydrofluoric acid (HF) can be used as an etchant. For example, diluted hydrofluoric acid, such as ultra-diluted HF, may be used. For example, the HF may be diluted in the ratio of 2000:1 (e.g., 1 part HF in 2000 parts water, such as de-ionized water). In another example, the dilution ratio may be in the range of about 1500:1 to about 2500:1, or about 1900:1 to about 2100:1. Diluted HF has excellent etch selectivity to the sacrificial material 409, as compared to the IPD layer 132a. Diluted HF has reasonably good etch selectivity to the layers 128, as compared to the IPD layer 132a. Furthermore, diluted HF as an etchant also provides relatively high cross-memory pillar etch uniformity and/or cross-wafer etch uniformity.

Thus, in an embodiment, any appropriate etchant, such as hot phosphoric acid, ultra-diluted HF, or another appropriate etchant that is selective to poly-Si (e.g., of the sacrificial material 409) and oxide (e.g., of the layers 128), as compared to nitride (e.g., of the IPD layer 132a), and that provides cross-memory pillar etch uniformity and/or cross-wafer etch uniformity, may be used.

Referring again to FIG. 4E, using an appropriate etchant as discussed above (e.g., phosphoric acid at a relatively high temperature, ultra-diluted hydrofluoric acid, and/or the like), the sections 432a3 of the IPD layer 132a are substantially removed. The sections 432a2 are also mostly removed. There may be some leftover portions of the sections 432a2 of the ILD layer 132a, which form a flank portion of the ILD layer 132a, and which are identified using dotted ovals and labelled as 132a1. Note in FIG. 4E a length La of the flank portion of the IPD layer 132—the length La will be discussed herein in turn.

The sacrificial material 409 is not significantly etched during the etching process. Hence, the section 42a1 of the IPD layer 132a is preserved.

In FIG. 4E, the layers 128a, 128b are illustrated to be not substantially etched, as the etchant used in the etching process has good etch selectivity to the layers 128, as compared to the IPD layer 132a. However, in practice, the layers 128a, 128b may be somewhat etched, resulting in the eroded corners of the layers 128a, 128b and somewhat tapered shape of the layers 128, as illustrated in FIG. 4E'. For example, a length Lp at or near an end of the layer 128b is less than a length Lq at a section of the layer 128 that is adjacent to the IPD layer 132a, as illustrated in FIG. 4E'. For purposes of illustrative simplicity, FIGS. 4F-4I assume the profile of the layers 128 of FIG. 4E, and not the profile of the layers 128 of FIG. 4E'.

Figure 4F:
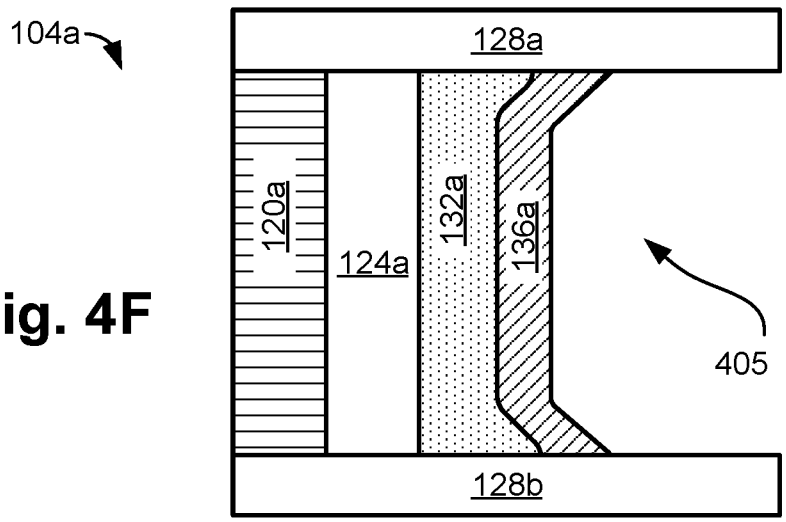

Referring now to FIG. 4F, the sacrificial material 409 is removed, e.g., using etchant that is selective to the layers 128 and the IPD layer 132a, as compared to the sacrificial material 409 (i.e., the material of the sacrificial material 409 etches much faster than the IPD layer 132a and the layers 128). Subsequently, IPD layer 136a is formed. For example, the IPD layer 136a may be grown by a thermal oxidation process on the IPD layer 132a. In another example embodiment, the IPD layer 124a may be formed through any appropriate type of deposition process, as discussed with respect to FIGS. 5A-5C herein later. Because in FIG. 4F, the IPD layer 136a is grown by a thermal oxidation process on the IPD layer 132a, the IPD layer 136a somewhat retains a shape of the IPD layer 132a. In an example, the IPD layer 132a does not grow through oxidation on the layers 128. Accordingly, sections of the horizontal sidewalls of the layers 128 within the recess 405 do not have any formation of the IPD layer 136a thereon.

Figure 4G:
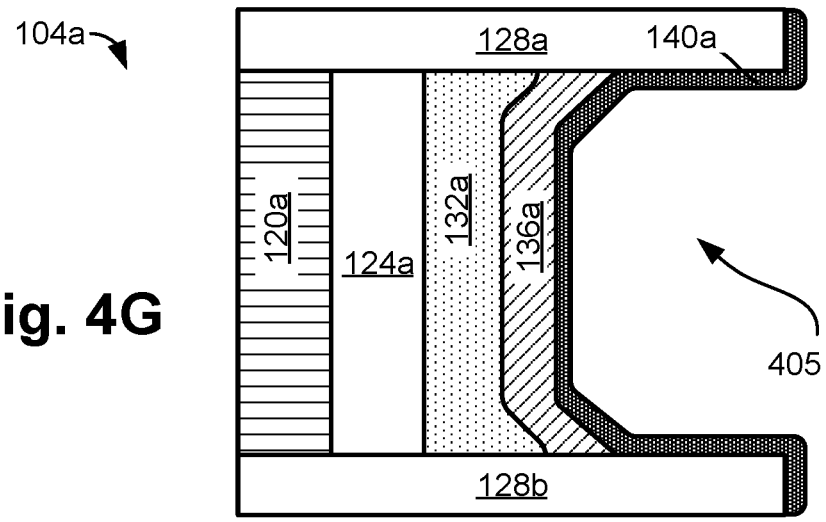

Referring now to FIG. 4G, the IPD layer 140 is deposited within the recess 405, e.g., to cover the exposed surfaces of the IPD layer 136a, and the horizontal and vertical surfaces of the layers 128. In an example, the IPD layer 140a is conformally deposited. The deposition of the IPD layer 140a is performed using CVD, ALD, PVD, diffusion, and/or any appropriate deposition technique.

Figure 4H:
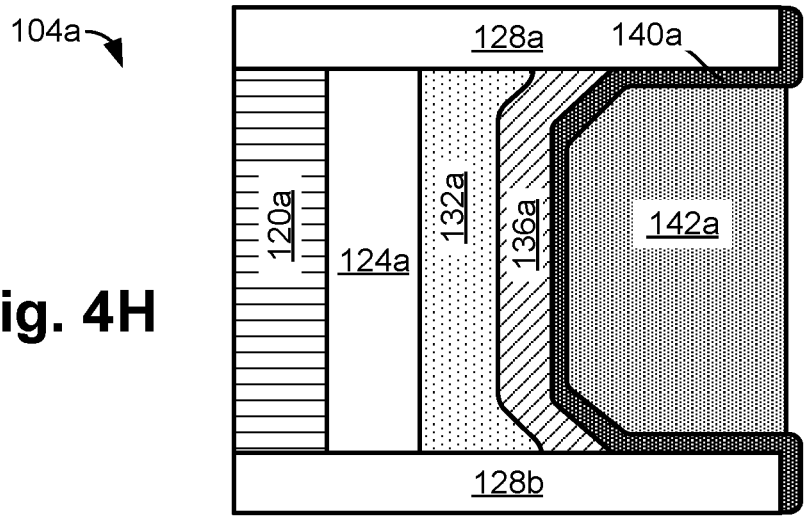

Referring now to FIG. 4H, the floating gate 142a is formed within the recess 405 of FIG. 4F. In an example, the floating gate 142a can include any suitable conductive material, such as polysilicon, which is conductively doped (e.g., to an N+ type conductivity). In another example, the floating gate 142 comprises conductive or semi-conductive material, such as polysilicon, SiN, silicated or non-silicated metal such as ruthenium (Ru), platinum (Pt), germanium (Ge), etc. The floating gate 142a can be formed by any suitable process or technique, such as a deposition process, e.g., using CVD, ALD, PVD, etc.

Figure 4I:
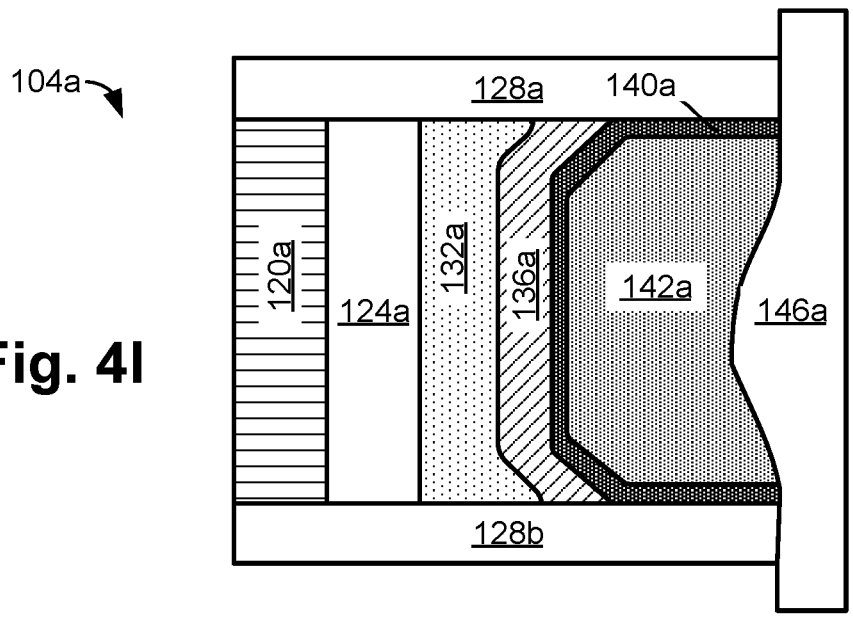

Referring now to FIG. 4I, the tunnel dielectric layer 146a is formed. In the example of FIG. 4I, a section of the tunnel dielectric layer 146a protrudes or extends within the floating gate 142a. However, in another example embodiment, the tunnel dielectric layer 146a does not protrude or extend within the floating gate 142a. The memory cell 104a of FIG. 4I is similar to that in FIGS. 1 and 2.

In the example of FIG. 4F, the IPD layer 136a is grown through thermal oxidation process. However, the IPD layer 136a can be formed through deposition as well. For example, FIGS. 5A, 5B, 5C, 5D, and 5E collectively illustrate example methods for forming a memory cell of a flash memory, such as the memory cell 304a of FIG. 3, where a IPD2 layer (such as the layer 132a) of the memory cell does not flank a floating gate 142a of the memory cell, and where a IPD3 layer (e.g., IPD layer 336a) is formed through a deposition process, in accordance with some embodiments of the present disclosure. Cross sectional views of the memory cell 304a, while the memory cell 304a is being formed, are illustrated in FIGS. 5A-5F.

Figure 5A:
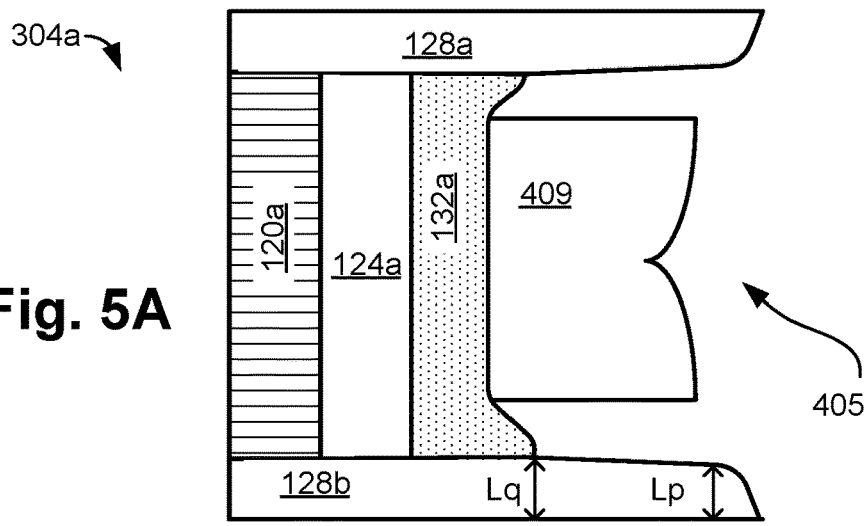
FIGS. 5A, 5B, 5C, 5D, and 5E collectively illustrate example methods for forming a memory cell of a flash memory, such as a memory cell of FIG. 3, where a nitrogen-containing IPD2 layer of the memory cell does not flank a floating gate of the memory cell, and where an IPD3 layer is formed through an additive deposition process rather than oxidation, in accordance with some embodiments of the present disclosure.

Referring to FIG. 5A, the memory cell 304a is similar to the memory cell 104a of FIG. 4E', and is formed using operations discussed with respect to FIGS. 4A, 4B, 4C, 4D, and 4E'.

Figure 5B:
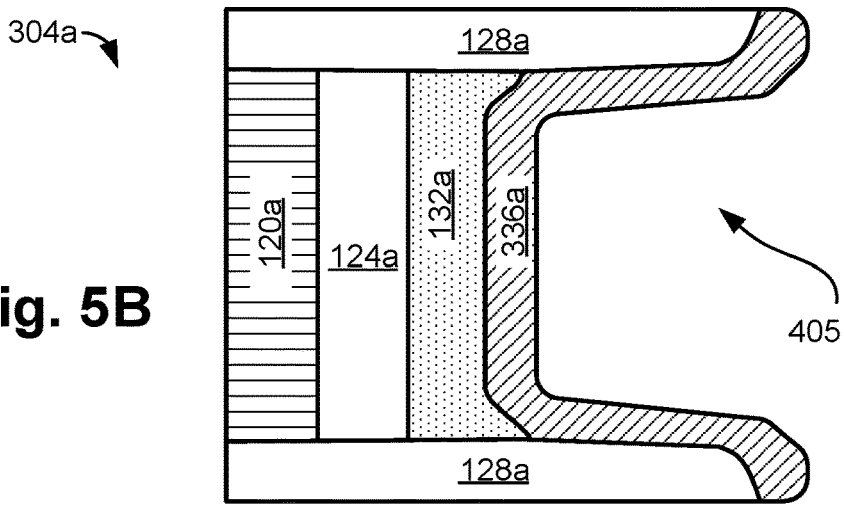

Referring now to FIG. 5B, the sacrificial material 409 is removed (e.g., as discussed with respect to FIG. 4F). Subsequently, the IPD layer 336a is deposited, e.g., using CVD, ALD, PVD, diffusion, and/or any appropriate deposition technique. Because the IPD layer 336a in FIG. 5B is deposited (e.g., as opposed to being grown using oxidation, as illustrated in FIG. 4F), the IPD layer 336a of FIG. 5B covers an entirety of the horizontal surfaces of the layers 128 within the recess 405, and also covers the vertical surfaces of the layers 128 outside the recess 405.

Figure 5C:
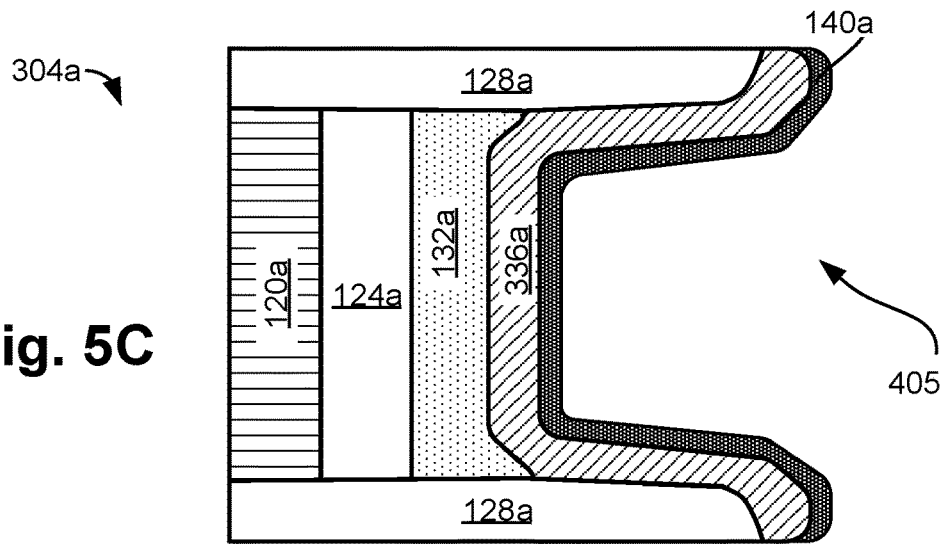
Figure 5D:
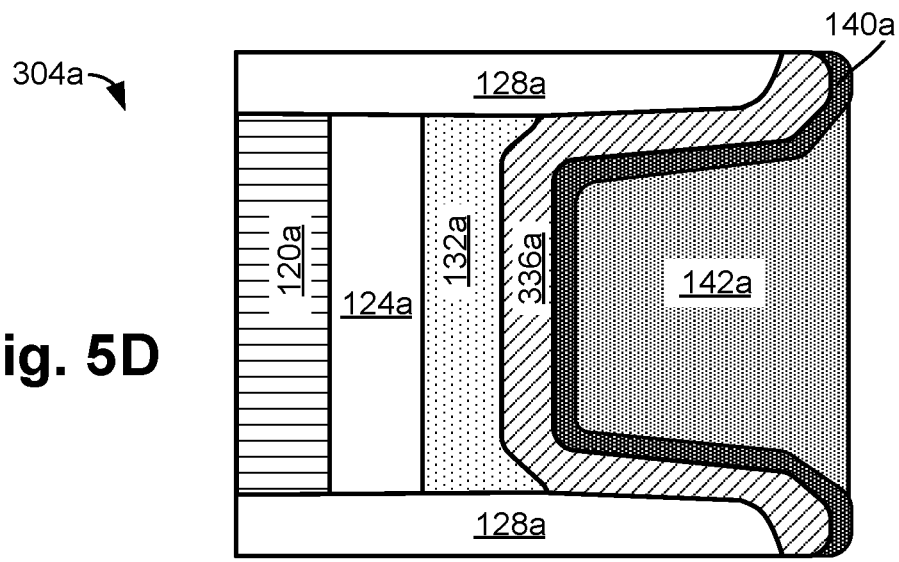
Figure 5E:
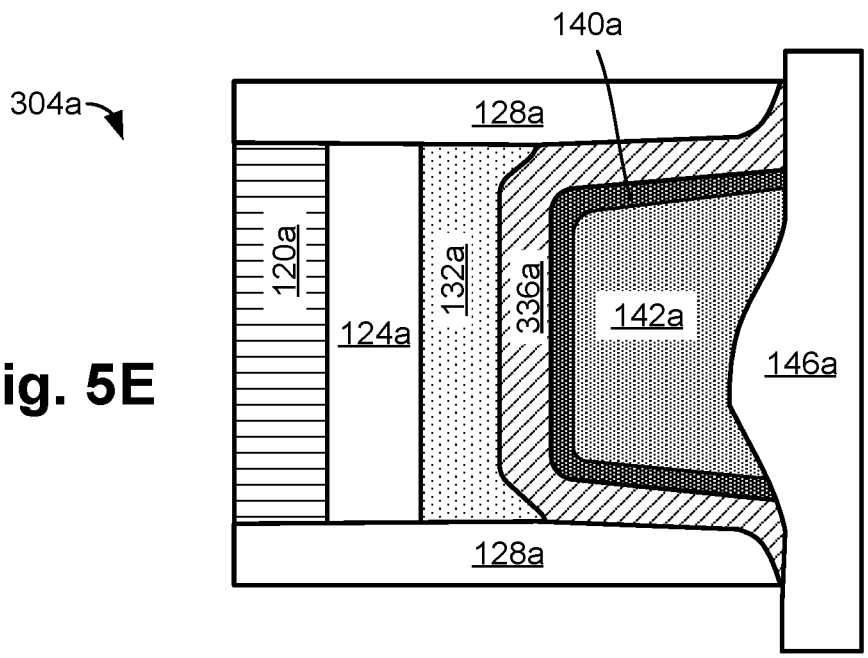

Referring now to FIG. 5C, the IPD layer 140a is deposited, e.g., as discussed with respect to FIG. 4G. Referring to FIG. 5D, the floating gate 142a is formed, e.g., as discussed with respect to FIG. 4H. Referring to FIG. 5E, the tunnel dielectric layer 146a is formed, e.g., as discussed with respect to FIG. 4I. The memory cell 304a of FIG. 5E is similar to that in FIG. 3.

As discussed with respect to FIGS. 4E and 4E', sections of the layer 128 may be removed due to the etching of the IPD layer 132a (e.g., thereby leading to a tapered shape of the layers 128 in FIGS. 4E' and 4E). In some examples, this may result in inferior critical dimensions (CD) of the layers 128 in the memory pillar 100 and/or inferior Gate Coupling Ratio (GCR) of the memory cell 104a, leading to relatively poor program and/or erase capability of the memory cells. However, any such possible loss of the layers 128 are overcome by depositing the layer 336a, as discussed with respect to FIGS. 5A-5E (e.g., instead of thermally growing the layer via oxidation). Depositing the IPD3 layer (e.g., instead of thermally growing the layer via oxidation) at least in part compensates for the loss of the layer 128 due to etching of the IPD layer 132a, and also retains control gate pocket size. This may not be possible if the IPD3 layer (e.g., IPD layer 136a) is grown via thermal oxidation from the IPD2 layer (e.g., IPD layer 132a), e.g., as the IPD layer 136a would not grow on sidewalls of the layer 128, therefore leading to a net pocket size loss.

Figure 6A:
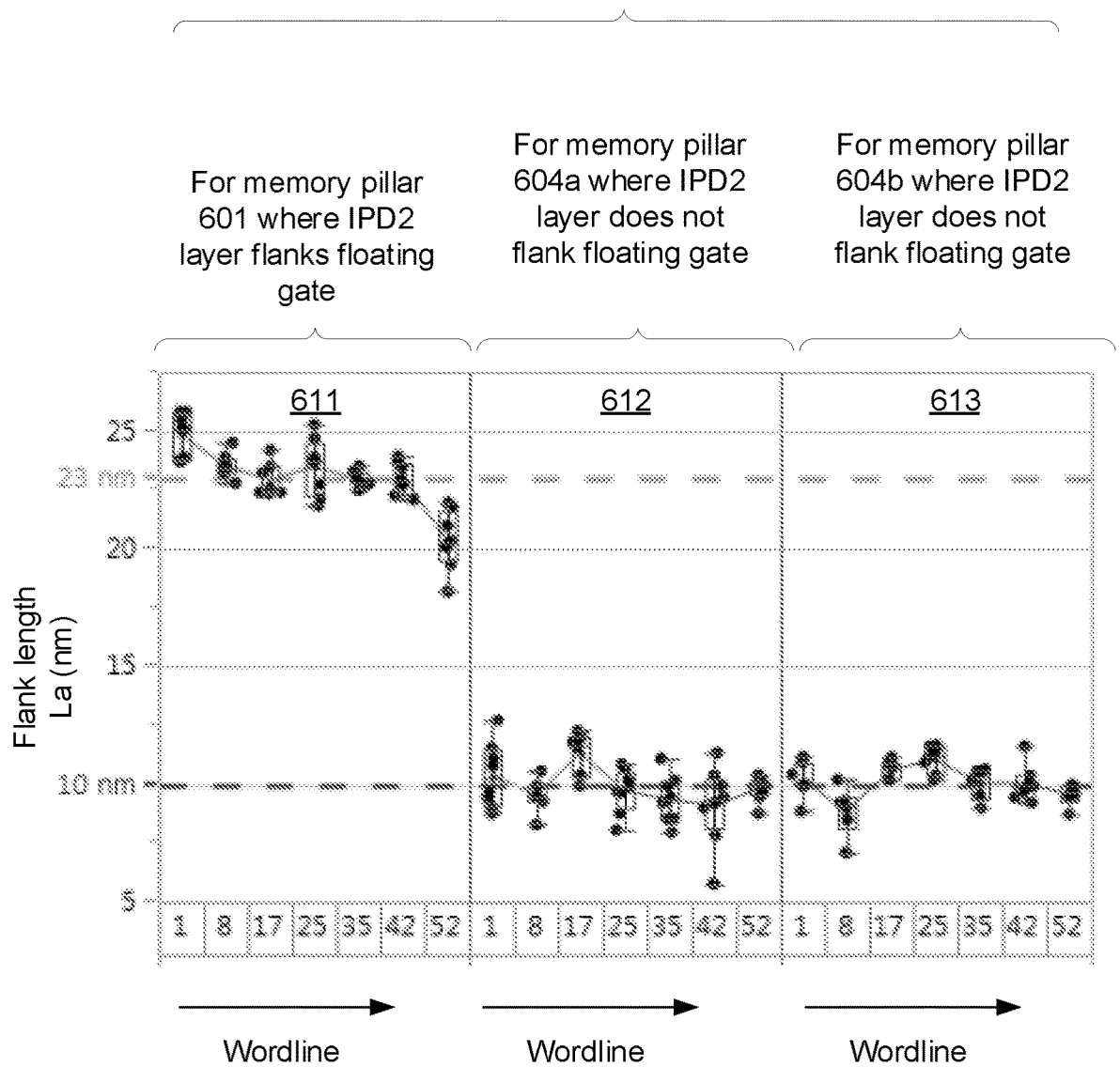
FIG. 6A illustrates three plots, each illustrating variations in flank length of a nitride-containing IPD2 layer along various word lines, wherein the first plot is for a memory pillar where the nitride-containing IPD2 layer flanks the floating gate in individual memory cells, and the second and third plots are for memory pillars where the respective nitride-containing IPD2 layers do not flank the floating gate in individual memory cells, and where the various memory pillars are in a central region of the corresponding wafers, in accordance with some embodiments.

FIG. 6A illustrates three plots 611, 612, 613, each illustrating variations in flank length (e.g., which is the length La of FIGS. 4E, 4E') along various word lines—a first plot 611 is for a memory pillar 601 where the IPD2 layer flanks the floating gate in individual memory cells, and a second plot 612 and a third plot 613 are respectively for memory pillars 604a and 604b where the IPD2 layer (e.g., such as the layer 132a) does not flank the floating gate in individual memory cells (such as in the memory cell 104a, 304a, etc.), and where the various memory pillars of the plots of FIG. 6A are in a central region of corresponding wafers, in accordance with some embodiments.

For example, in each of the plots 611, 612, 613, the X axis represents the flank length La for the IPD2 layer for word lines 1, 8, 17, 25, 35, 42, and 52. For example, if word line 1 is coupled to the control gate 120a of the memory cell 104a of FIG. 1, then word line 2 is coupled to the control gate 120b of the memory cell 104b, word line 3 is coupled to the control gate 120c of the memory cell 104c, and so on. Thus, each of the plots 611, 612, 613 represents a level of uniformity in the flank length La in different memory cells along a vertical direction (e.g., a direction parallel to a channel region) of the corresponding memory pillar. Thus, in essence, each of the plots 611, 612, 613 represents a level of cross-memory pillar uniformity, as previously discussed with respect to FIG. 4E.

As illustrated, in the plot 611, the flank length is roughly between 18-27 nm, and the flank length La is relatively non-uniform along different word lines of the memory pillar 601. The flank length La is relatively high, because the IPD2 layer flanks the floating gate, as illustrated in FIG. 6A.

In contrast, in the plots 612 and 613, the flank length is roughly between 7.5-12.5 nm, and the flank length La is relatively uniform along different word lines of the memory pillar 601. The flank length La is relatively low, because the IPD2 layer does not flank the floating gate.

Thus, plots 612 and 613 illustrate that in memory pillars where the IPD2 layer (e.g., layer 132a) does not flank the floating gate, cross-pillar uniformity can be achieved, and thus, superior critical dimensions (CD) of the memory pillar is achieved.

Figure 6B:
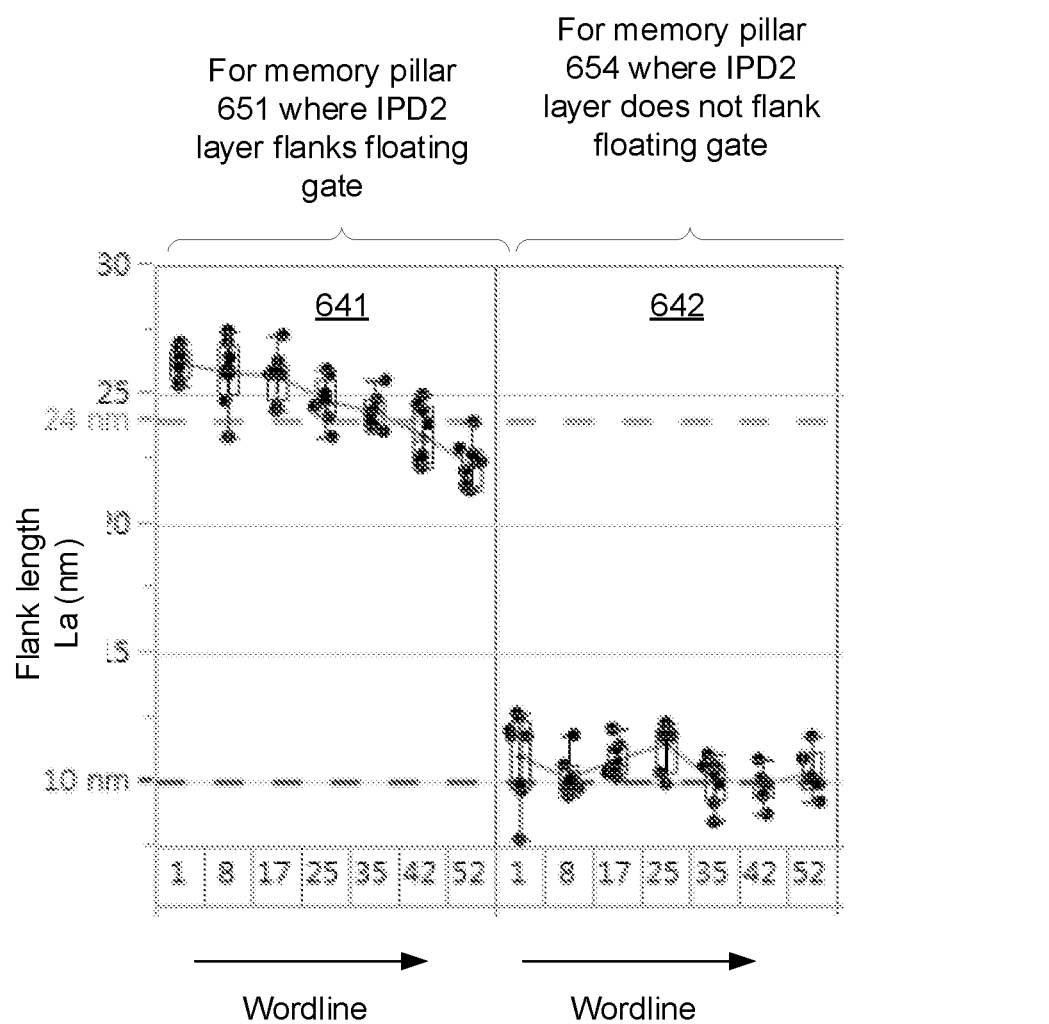
FIG. 6B illustrates two plots, each illustrating variations in flank length of a nitride-containing IPD2 layer along various word lines, wherein the first plot is for a memory pillar where the nitride-containing IPD2 layer flanks the floating gate in individual memory cells, and the second plot is for a memory pillar where the nitride-containing IPD2 layer does not flank the floating gate in individual memory cells, and where the various memory pillars are in an edge region of the corresponding wafers, in accordance with some embodiments.

FIG. 6B illustrates two plots 641, 642, each illustrating variations in flank length (e.g., length La of FIGS. 4E, 4E') along various word lines—the first plot 641 is for a memory pillar 651 where the IPD2 layer flanks the floating gate in individual memory cells, and the second plot 642 is for memory pillar 654 where the IPD2 layer (e.g., such as the layer 132a) does not flank the floating gate in individual memory cells (such as in the memory cell 104a, 304a, etc.), and where the various memory pillars of the plots of FIG. 6B are in an edge region of corresponding wafers, in accordance with some embodiments. The plots are self-explanatory in view of the discussion of the plots of FIG. 6A. As illustrated in FIG. 6B, plot 642 illustrates that in memory pillars where the IPD2 layer (e.g., layer 132a) does not flank the floating gate, cross-pillar uniformity is achieved, and thus, superior CD of the memory pillar is achieved.

Furthermore, comparing FIGS. 6A and 6B, in FIG. 6A various memory pillars of the plots 612, 613 are in the central region of corresponding wafers, and in FIG. 6B various memory pillars of the plot 642 are at or near the edge region of corresponding wafer. Thus, the plots 612, 613 and 642 illustrates high cross wafer uniformity of the flank length La for the IPD2 layer, as the flank length La is substantially uniform in the central region of the wafers, as well as at or near the edge region.

Figure 7:
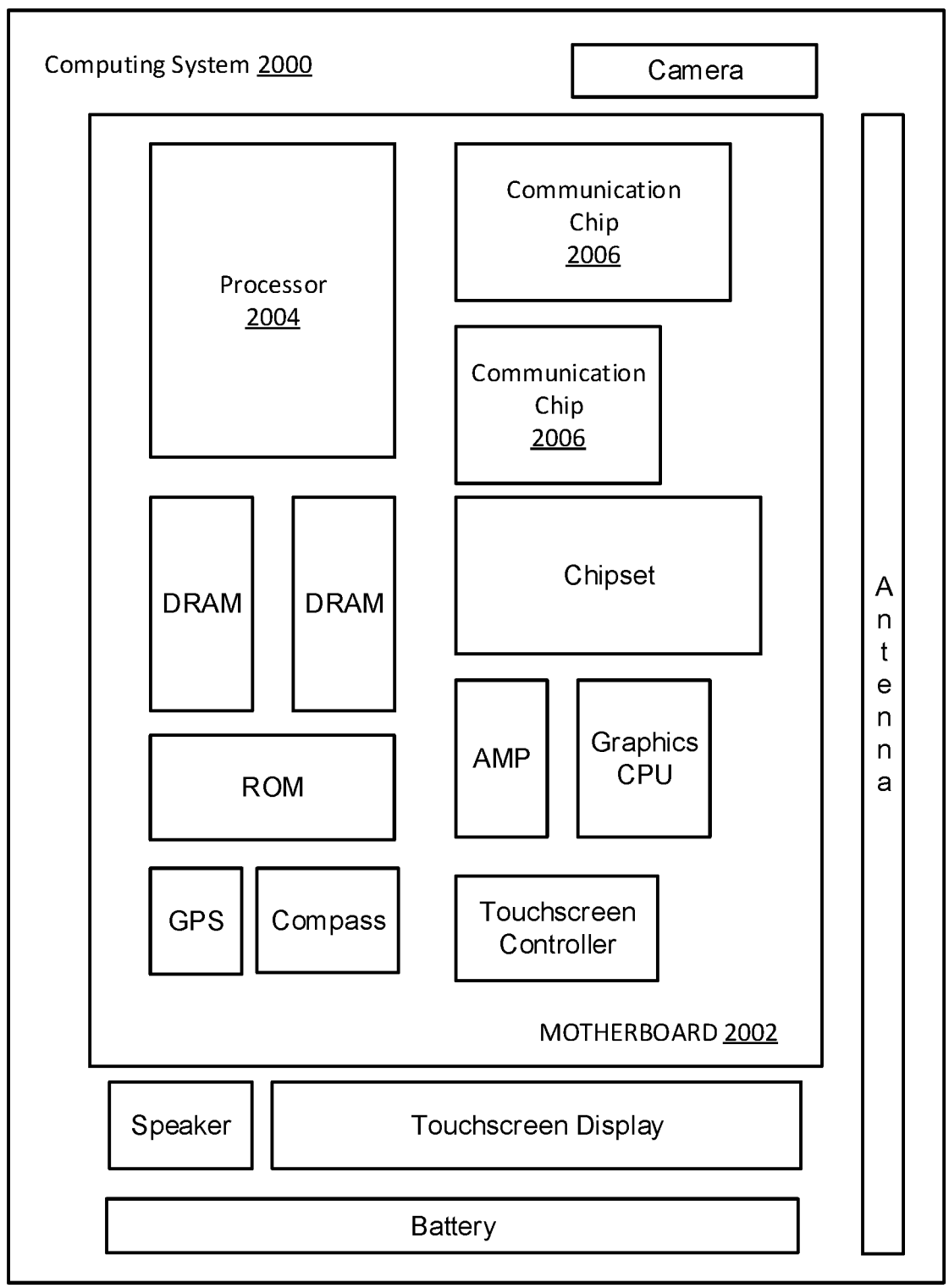
FIG. 7 illustrates an example computing system implemented with memory structures as disclosed herein, in accordance with one or more embodiments of the present disclosure.

FIG. 7 illustrates an example computing system implemented with memory structures formed using the techniques disclosed herein, in accordance with one or more embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board, whether a main board, a daughterboard mounted on a main board, or the only board of system 2000, etc.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM, flash memory such as 3D NAND flash memory), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 2006 can be part of or otherwise integrated into the processor 2004).

Any memory, such as any flash memory (e.g., a 3D NAND flash memory), included in computing system 2000 may include one or more memory pillars configured in accordance with an example embodiment. For example, memory cells of individual pillars may have IPD2 layers that do not flank corresponding floating gates, as variously described herein.

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing system 2000 includes an integrated circuit die packaged within the processor 2004. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing system 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices, as variously described herein.

FURTHER EXAMPLE EMBODIMENTS

Numerous variations and configurations will be apparent in light of this disclosure, and in light of the following examples.

Example 1

An integrated circuit memory component comprising: a floating gate; a control gate; and a first layer, a second layer, and a third layer laterally between the floating gate and the control gate, wherein the second layer is between the first layer and the third layer, and each of the first second, and third layers is a continuous layer of dielectric material, and wherein the second layer does not flank the floating gate, such that no portion of the floating gate is laterally between two sections of the second layer.

Example 2

The integrated circuit memory component of example 1, wherein the second layer comprises a nitride.

Example 3

The integrated circuit memory component of any of examples 1-2, wherein: the memory component comprises a first memory cell that is adjacent to a second memory cell, the first and second memory cells included in a memory cell string; the floating gate is a first floating gate, the second memory cell comprising a second floating gate; and the second layer does not flank the first floating gate such that no portion of the second layer is laterally between the first floating gate and the second floating gate.

Example 4

The integrated circuit memory component of any of examples 1-2, wherein: the memory component comprises a first memory cell that is adjacent to a second memory cell, the first and second memory cells included in a memory cell string; the floating gate is a first floating gate, the second memory cell comprising a second floating gate; the first floating gate has a surface facing the control gate of the first memory cell, and the second floating gate has a surface facing a control gate of the second memory cell; an imaginary straight line passes through the surface of the first floating gate and through the surface of the second floating gate; the control gates of the first and second memory cells are on a first side of the imaginary straight line, and a second side of the imaginary straight line is opposite the first side; and the second layer does not flank the floating gate such that the second layer is entirely on the first side of the imaginary straight line.

Example 5

The integrated circuit memory component of any of examples 1-4, further comprising: a fourth layer comprising insulating material and a fifth layer comprising insulating material, wherein the floating gate is between the fourth and fifth layers, such that one of the fourth or fifth layers is above the floating gate and the other of the fourth and fifth layers is below the floating gate, and wherein the second layer does not flank the floating gate such that no portion of the second layer is between the floating gate and the fourth layer, or between the floating gate and the fifth layer.

Example 6

The integrated circuit memory component of example 5, wherein the control gate is between the fourth and fifth layers, such that one of the fourth or fifth layers is above the control gate and the other of the fourth and fifth layers is below the control gate.

Example 7

The integrated circuit memory component of any of examples 5-6, wherein: the second layer includes nitrogen; the third layer is laterally between the second layer and the floating gate; and the third layer flanks the floating gate, such that a first section of the third layer is laterally between the floating gate and the fourth layer, and a second section of the third layer is between the floating gate and the fifth layer.

Example 8

The integrated circuit memory component of any of examples 1-4, further comprising: a fourth layer laterally between the third layer and the floating gate, the fourth layer being at least 2 times thinner than the second and third layers, wherein each of the third layer and the fourth layer flanks the floating gate.

Example 9

The integrated circuit memory component of example 8, wherein the fourth layer is at least 4 times thinner than the second layer.

Example 10

The integrated circuit memory component of any of examples 8-9, wherein the fourth layer comprises nitrogen.

Example 11

The integrated circuit memory component of any of examples 1-10, wherein each of the first layer and the third layer comprises oxygen, and the second layer comprises nitrogen.

Example 12

The integrated circuit memory component of any of examples 1-11, wherein each of the first layer, second layer, and third layer comprises Inter-Poly Dielectric (IPD) material.

Example 13

The integrated circuit memory component of any of examples 1-12, wherein: the first layer comprises oxygen and at least one of silicon and/or a high-k dielectric material; the second layer comprises nitrogen; and the third layer comprises oxygen and at least one of silicon and/or a high-k dielectric material.

Example 14

The integrated circuit memory component of any of examples 1-13, wherein: the floating gate has a first maximum length in a first direction that is parallel to a memory cell string that includes the memory component; the control gate has a second maximum length in a second direction parallel to the first direction; and a difference between the second maximum length and the first maximum length is less than 8 nanometers (nm).

Example 15

The integrated circuit memory component of example 14, wherein the difference between the second maximum length and the first maximum length is less than 6 nm.

Example 16

The integrated circuit memory component of example 14, wherein the difference between the second maximum length and the first maximum length is less than 4 nm.

Example 17

The integrated circuit memory component of example 14, wherein the difference between the second maximum length and the first maximum length is less than 2 nm.

Example 18

The integrated circuit memory component of any of examples 1-17, wherein the memory component is a memory cell of a flash memory.

Example 19

The integrated circuit memory component of any of examples 1-18, wherein the memory component is a memory cell of a three-dimensional (3D) NAND flash memory.

Example 20

The integrated circuit memory component of any of examples 1-19, wherein: the floating gate has a first surface facing the control gate, an opposite second surface having a first length, and one or more additional surfaces between the first and second surfaces; and the third layer flanks an entirety of the additional one or more surfaces of the floating gate.

Example 21

The integrated circuit memory component of any of examples 1-19, wherein: the floating gate has a first surface facing the control gate, an opposite second surface having a first length, and one or more additional surfaces between the first and second surfaces; and the third layer flanks a section, but not an entirety, of the additional one or more surfaces of the floating gate.

Example 22

A motherboard, wherein the integrated circuit memory component of any of examples 1-21 is attached to the motherboard.

Example 23

A computing system comprising the integrated circuit memory component of any of examples 1-22.

Example 24

A three-dimensional flash memory comprising a plurality of memory cells arranged in a memory cell string, the plurality of memory cells comprising: a first memory cell including a first charge storage structure, a control gate, and an Inter-Poly Dielectric (IPD) material comprising nitrogen and laterally between the first charge storage structure and the control gate; and a second memory cell adjacent to the first memory cell, the second memory cell including a second charge storage structure, wherein no portion of the IPD material is between the first charge storage structure and the second charge storage structure.

Example 25

The three-dimensional flash memory of example 24, further comprising: insulating material between the first memory cell and the second memory cell, wherein no portion of the IPD material is laterally between the first charge storage structure and the insulating material.

Example 26

The three-dimensional flash memory of any of examples 24-25, wherein the IPD material is first IPD material, and wherein the first memory cell further comprises: a second IPD material including oxygen and a third IPD material including oxygen, wherein the first IPD material is interposed between the second IPD material and third IPD material.

Example 27

The three-dimensional flash memory of any of examples 24-26, wherein: a difference between a maximum length of the first charge storage structure along a direction parallel to the memory cell string and a maximum length of the control gate along the direction is at most 8 nanometers.

Example 28

The three-dimensional flash memory of example 27, wherein the difference between the maximum length of the first charge storage structure and the maximum length of the control gate is less than 6 nm.

Example 29

The three-dimensional flash memory of example 27, wherein the difference between the maximum length of the first charge storage structure and the maximum length of the control gate is less than 4 nm.

Example 30

The three-dimensional flash memory of example 30, wherein the difference between the maximum length of the first charge storage structure and the maximum length of the control gate is less than 2 nm.

Example 31

The three-dimensional flash memory of any of examples 24-31, wherein the IPD material is included in an intermediate layer of a plurality of IPD layers.

Example 32

A motherboard, wherein the three-dimensional flash memory of any of examples 24-31 is attached to the motherboard.

Example 33

A computing system comprising the three-dimensional flash memory of any of examples 24-32.

Example 34

A method to form a flash memory cell, the method comprising: forming a control gate, wherein the control gate is between a first layer and a second layer, the first layer and the second layer comprising insulating material, and the control gate, the first layer and the second layer defining a recess; forming a first dielectric layer within the recess and adjacent to the control gate; forming a second dielectric layer within the recess, a first section of the second dielectric layer adjacent to the first dielectric layer, and a second section of the second dielectric layer adjacent to the first layer; forming sacrificial material that covers at least a part of the first section of the second dielectric layer, wherein at least a part of the second section of the second dielectric layer is exposed through the sacrificial material; and selectively etching portions of the second dielectric layer without substantially etching the sacrificial material, wherein at least a portion of the second section of the second dielectric layer is etched and the first section of the second dielectric layer is not etched.

Example 35

The method of example 34, wherein selectively etching portions of the second dielectric layer comprises: selectively etching portions of the second dielectric layer using an etchant comprising hydrogen and fluorine.

Example 36

The method of any of examples 34-35, wherein selectively etching portions of the second dielectric layer comprises: selectively etching portions of the second dielectric layer using an etchant comprising diluted Hydrofluoric acid, wherein the Hydrofluoric acid is diluted in a ratio that ranges from 1900:1 to 2100:1.

Example 37

The method of any of examples 34-36, wherein selectively etching portions of the second dielectric layer comprises: selectively etching portions of the second dielectric layer using phosphoric acid.

Example 38

The method of any of examples 34-37, further comprising: removing the sacrificial material; and depositing a third dielectric layer adjacent to the second dielectric layer.

Example 39

The method of example 38, further comprising: forming a floating gate adjacent to the third dielectric layer.

Example 40

The method of example 39, wherein the second dielectric layer does not flank the floating gate.

The foregoing detailed description has been presented for illustration. It is not intended to be exhaustive or to limit the disclosure to the precise form described. Many modifications and variations are possible in light of this disclosure. Therefore it is intended that the scope of this application be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit memory component comprising:
   a floating gate;
   a control gate; and
   a first layer, a second layer, and a third layer laterally between the floating gate and the control gate,
   wherein the second layer is between the first layer and the third layer, and each of the first second, and third layers is a continuous layer of dielectric material, and
   wherein the second layer does not flank the floating gate, such that no portion of the floating gate is laterally between two sections of the second layer.

2. The integrated circuit memory component of claim 1, wherein the second layer comprises a nitride.

3. The integrated circuit memory component of claim 1, wherein:
   the memory component comprises a first memory cell that is adjacent to a second memory cell, the first and second memory cells included in a memory cell string;
   the floating gate is a first floating gate, the second memory cell comprising a second floating gate; and
   the second layer does not flank the first floating gate such that no portion of the second layer is laterally between the first floating gate and the second floating gate.

4. The integrated circuit memory component of claim 1, wherein:
   the memory component comprises a first memory cell that is adjacent to a second memory cell, the first and second memory cells included in a memory cell string;
   the floating gate is a first floating gate, the second memory cell comprising a second floating gate;
   the first floating gate has a surface facing the control gate of the first memory cell, and the second floating gate has a surface facing a control gate of the second memory cell;
   an imaginary straight line passes through the surface of the first floating gate and through the surface of the second floating gate;
   the control gates of the first and second memory cells are on a first side of the imaginary straight line, and a second side of the imaginary straight line is opposite the first side; and
   the second layer does not flank the floating gate such that the second layer is entirely on the first side of the imaginary straight line.

5. The integrated circuit memory component of claim 1, further comprising:
   a fourth layer comprising insulating material and a fifth layer comprising insulating material,
   wherein the floating gate is between the fourth and fifth layers, such that one of the fourth or fifth layers is above the floating gate and the other of the fourth and fifth layers is below the floating gate, and
   wherein the second layer does not flank the floating gate such that no portion of the second layer is between the floating gate and the fourth layer, or between the floating gate and the fifth layer.

6. The integrated circuit memory component of claim 5, wherein:
   the second layer includes nitrogen;
   the third layer is laterally between the second layer and the floating gate; and
   the third layer flanks the floating gate, such that a first section of the third layer is laterally between the floating gate and the fourth layer, and a second section of the third layer is between the floating gate and the fifth layer.

7. The integrated circuit memory component of claim 1, further comprising:
   a fourth layer laterally between the third layer and the floating gate,
   wherein each of the third layer and the fourth layer flanks the floating gate.

8. The integrated circuit memory component of claim 1, wherein each of the first layer and the third layer comprises oxygen, and the second layer comprises nitrogen.

9. The integrated circuit memory component of claim 1, wherein:
   the floating gate has a first maximum length in a first direction that is parallel to a memory cell string that includes the memory component;
   the control gate has a second maximum length in a second direction parallel to the first direction; and
   a difference between the second maximum length and the first maximum length is less than 8 nanometers (nm).

10. The integrated circuit memory component of claim 1, wherein the memory component is a memory cell of a three-dimensional (3D) NAND flash memory.

11. The integrated circuit memory component of claim 1, wherein:
    the floating gate has a first surface facing the control gate, an opposite second surface having a first length, and one or more additional surfaces between the first and second surfaces; and
    the third layer flanks an entirety of the additional one or more surfaces of the floating gate.

12. The integrated circuit memory component of claim 1, wherein:
- the floating gate has a first surface facing the control gate, an opposite second surface having a first length, and one or more additional surfaces between the first and second surfaces; and
- the third layer flanks a section, but not an entirety, of the additional one or more surfaces of the floating gate.

13. A motherboard, wherein the integrated circuit memory component of claim 1 is attached to the motherboard.

14. A three-dimensional flash memory comprising a plurality of memory cells arranged in a memory cell string, the plurality of memory cells comprising:
- a first memory cell including a first charge storage structure, a control gate, and an Inter-Poly Dielectric (IPD) material comprising nitrogen and laterally between the first charge storage structure and the control gate; and
- a second memory cell adjacent to the first memory cell, the second memory cell including a second charge storage structure,
- wherein no portion of the IPD material is between the first charge storage structure and the second charge storage structure.

15. The three-dimensional flash memory of claim 14, further comprising:
- insulating material between the first memory cell and the second memory cell,
- wherein no portion of the IPD material is laterally between the first charge storage structure and the insulating material.

16. The three-dimensional flash memory of claim 14, wherein the IPD material is first IPD material, and wherein the first memory cell further comprises:
- a second IPD material including oxygen and a third IPD material including oxygen, wherein the first IPD material is interposed between the second IPD material and third IPD material.

17. The three-dimensional flash memory of claim 14, wherein:
- a difference between a maximum length of the first charge storage structure along a direction parallel to the memory cell string and a maximum length of the control gate along the direction is at most 8 nanometers.

18. A method to form a flash memory cell, the method comprising:
- forming a control gate, wherein the control gate is between a first layer and a second layer, the first layer and the second layer comprising insulating material, and the control gate, the first layer and the second layer defining a recess;
- forming a first dielectric layer within the recess and adjacent to the control gate;
- forming a second dielectric layer within the recess, a first section of the second dielectric layer adjacent to the first dielectric layer, and a second section of the second dielectric layer adjacent to the first layer;
- forming sacrificial material that covers at least a part of the first section of the second dielectric layer, wherein at least a part of the second section of the second dielectric layer is exposed through the sacrificial material; and
- selectively etching portions of the second dielectric layer without substantially etching the sacrificial material, wherein at least a portion of the second section of the second dielectric layer is etched and the first section of the second dielectric layer is not etched.

19. The method of claim 18, wherein selectively etching portions of the second dielectric layer comprises:
- selectively etching portions of the second dielectric layer using an etchant comprising diluted Hydrofluoric acid, wherein the Hydrofluoric acid is diluted in a ratio that ranges from 1900:1 to 2100:1.

20. The method of claim 18, further comprising:
- removing the sacrificial material; and
- depositing a third dielectric layer adjacent to the second dielectric layer.

* * * * *